(12) United States Patent
Kanno et al.

(10) Patent No.: US 12,178,128 B2
(45) Date of Patent: Dec. 24, 2024

(54) PHOTOELECTRIC CONVERSION ELEMENT AND IMAGING DEVICE

(71) Applicant: Sony Group Corporation, Tokyo (JP)

(72) Inventors: Masato Kanno, Tokyo (JP); Yosuke Saito, Tokyo (JP)

(73) Assignee: Sony Group Corporation, Tokyo (JP)

( * ) Notice: Subject to any disclaimer, the term of this patent is extended or adjusted under 35 U.S.C. 154(b) by 710 days.

(21) Appl. No.: 17/599,389

(22) PCT Filed: Mar. 4, 2020

(86) PCT No.: PCT/JP2020/009098
§ 371 (c)(1),
(2) Date: Mar. 24, 2022

(87) PCT Pub. No.: WO2020/195633
PCT Pub. Date: Oct. 1, 2020

(65) Prior Publication Data
US 2022/0223802 A1    Jul. 14, 2022

(30) Foreign Application Priority Data

Mar. 28, 2019 (JP) ................. 2019-062367

(51) Int. Cl.
*H10K 85/60* (2023.01)
*H10K 30/30* (2023.01)
(Continued)

(52) U.S. Cl.
CPC ....... *H10K 85/6576* (2023.02); *H10K 30/353* (2023.02); *H10K 39/32* (2023.02); *H10K 85/211* (2023.02)

(58) Field of Classification Search
CPC ... H10K 30/353; H10K 39/32; H10K 85/6576
See application file for complete search history.

(56) References Cited

U.S. PATENT DOCUMENTS

| 8,138,355 B2 | 3/2012 | Watanabe |
| 2016/0351813 A1 | 12/2016 | Feng et al. |
| 2019/0044074 A1* | 2/2019 | Zhao ............... H10K 85/655 |

FOREIGN PATENT DOCUMENTS

| JP | 2009227670 A | 10/2009 |
| JP | 2010138077 A | 6/2010 |

(Continued)

OTHER PUBLICATIONS

Tsutsui, Yusuke, et al. "Evaluation of the intrinsic charge carrier transporting properties of linear- and bent-shaped π-extended benzo-fused thieno[3,2-b]thiophenes", Physical Chemistry Chemical Physics, Mar. 2015, pp. 9624-9628, DOI: 10.1039/c5cp00785b.

(Continued)

*Primary Examiner* — Daniel P Shook
(74) *Attorney, Agent, or Firm* — K&L Gates LLP

(57) ABSTRACT

A photoelectric conversion element according to an embodiment of the present disclosure includes: a first electrode; a second electrode that is opposed to the first electrode; and an organic photoelectric conversion layer that is provided between the first electrode and the second electrode, and includes, as a first organic semiconductor material, a benzothienobenzothiophene-based compound represented by a general formula (1).

14 Claims, 21 Drawing Sheets

(51) Int. Cl.
  *H10K 39/32* (2023.01)
  *H10K 85/20* (2023.01)

(56) References Cited

FOREIGN PATENT DOCUMENTS

| | | |
|---|---|---|
| JP | 2012510454 A | 5/2012 |
| JP | 2012129276 A | 7/2012 |
| JP | 2012206989 A | 10/2012 |
| JP | 2017038045 A | 2/2017 |
| JP | 2018142704 A | 9/2018 |
| WO | WO 2014027581 A1 | 2/2014 |

OTHER PUBLICATIONS

Cai, Zhengxu et al., Enhancement in Open-Circuit Voltage in Organic Solar Cells by Using Ladder-Type Nonfullerene Acceptors, ACS Applied Materials & Interfaces, Mar. 28, 2018, vol. 10, No. 16, pp. 13528-13533, DOI: 10.1021acsami.8b01308.
Seo, Hokuto et al., Jpn. J. Appl. Phys., vol. 49, No. 11, pp. 111601.1-11601.4 (2010).
Translation of International Search Report mailed Sep. 6, 2020 in connection with PCT/JP2020/009098.

\* cited by examiner

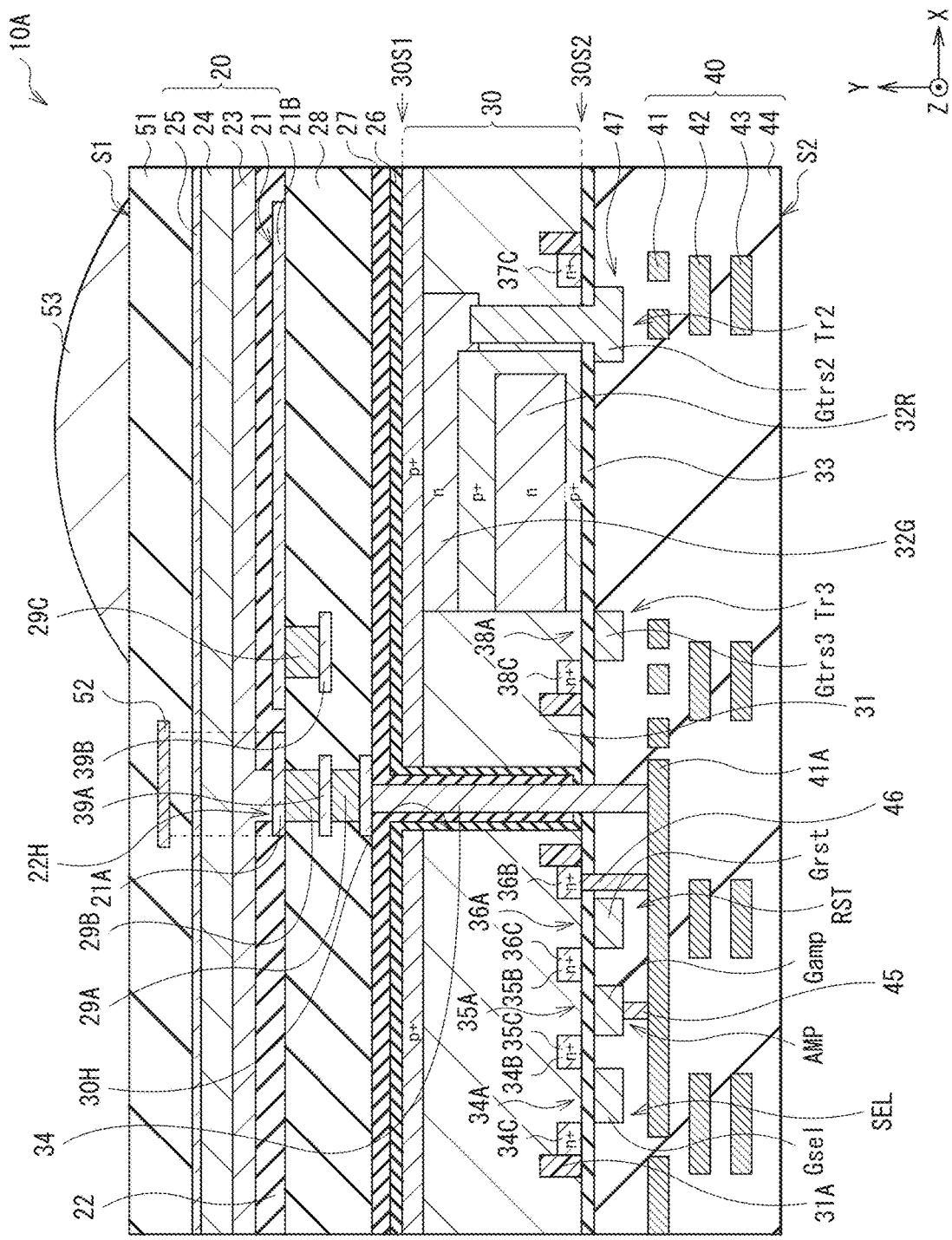
[FIG. 1]

[FIG. 2]
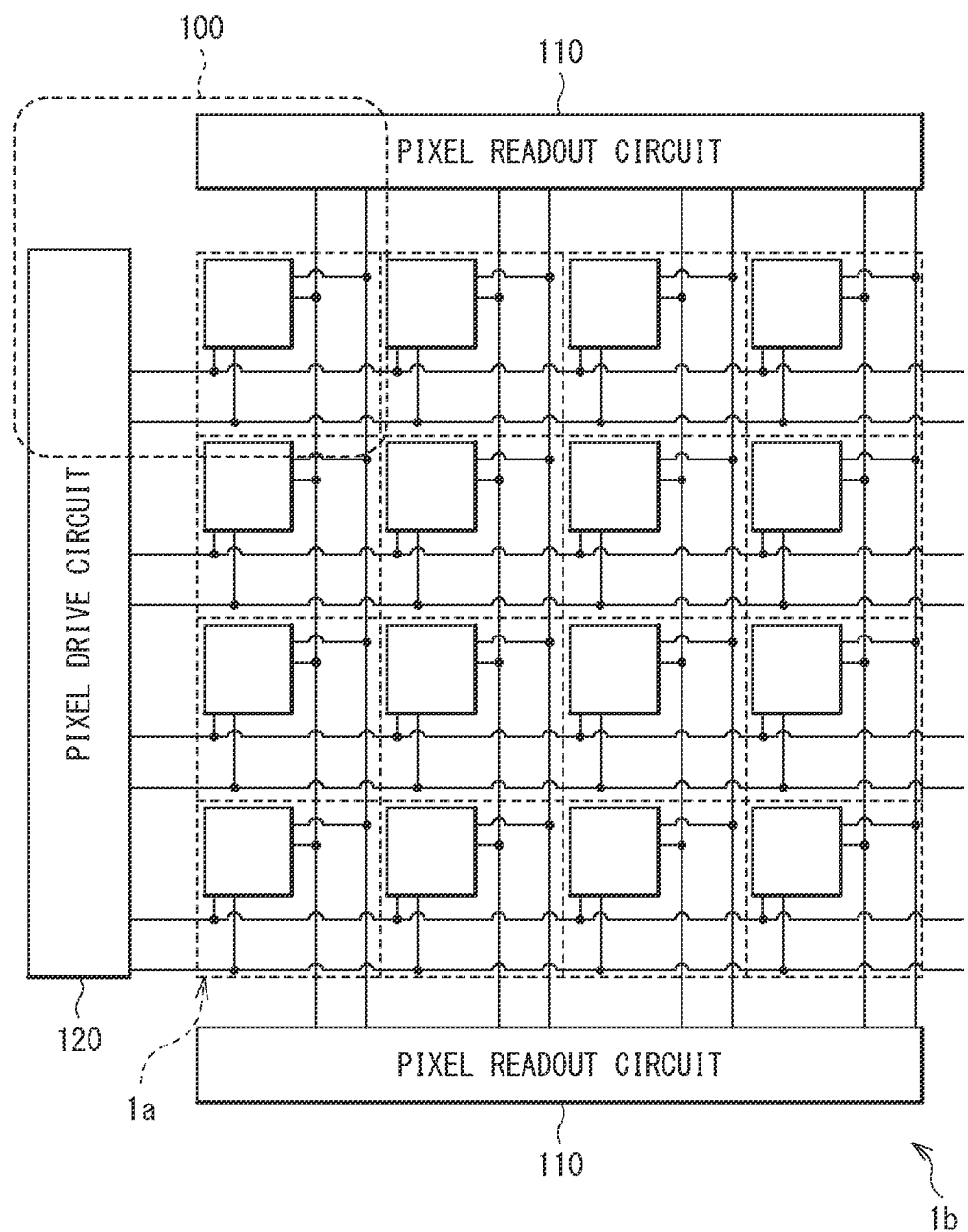

[FIG.3]
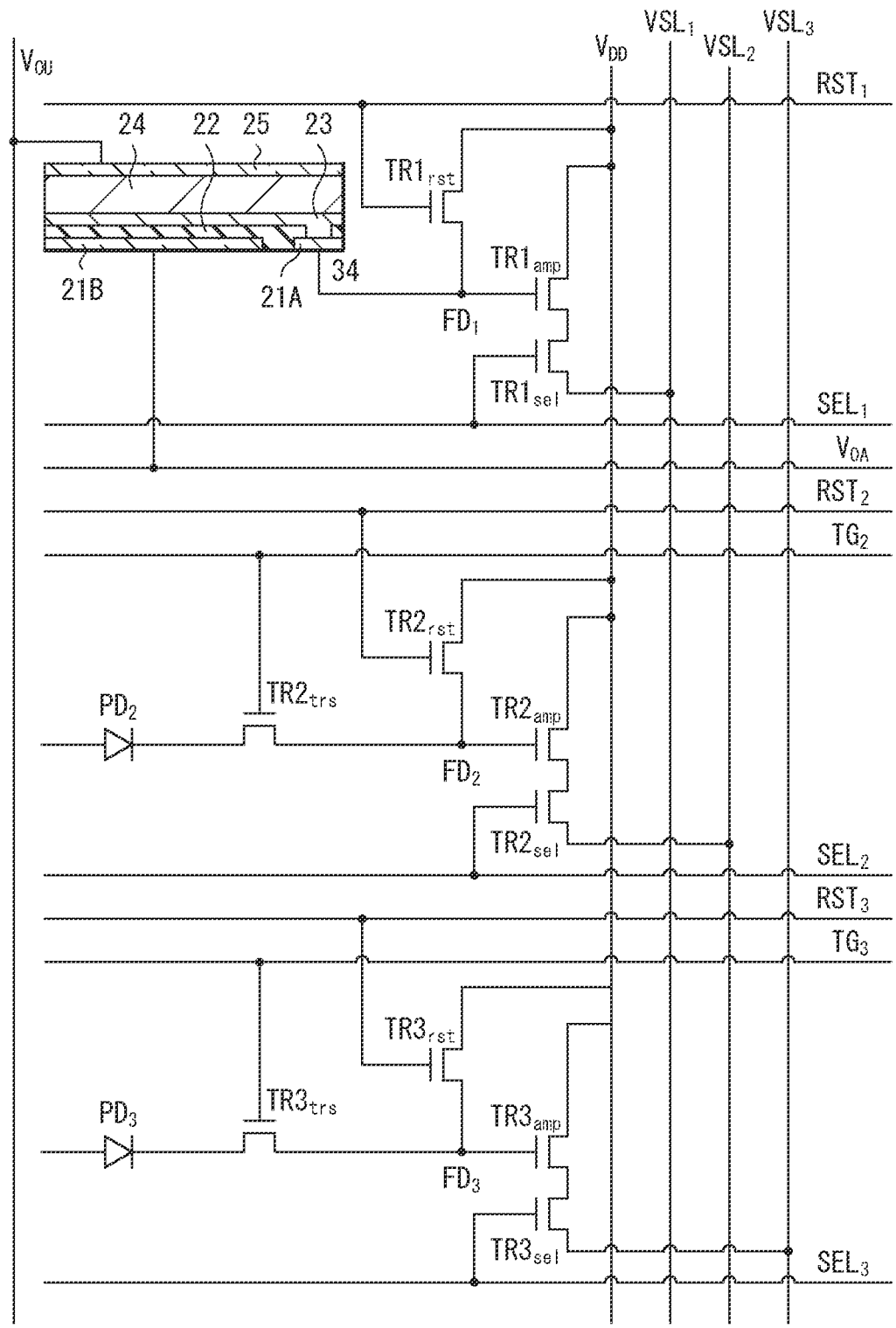

[FIG. 4]
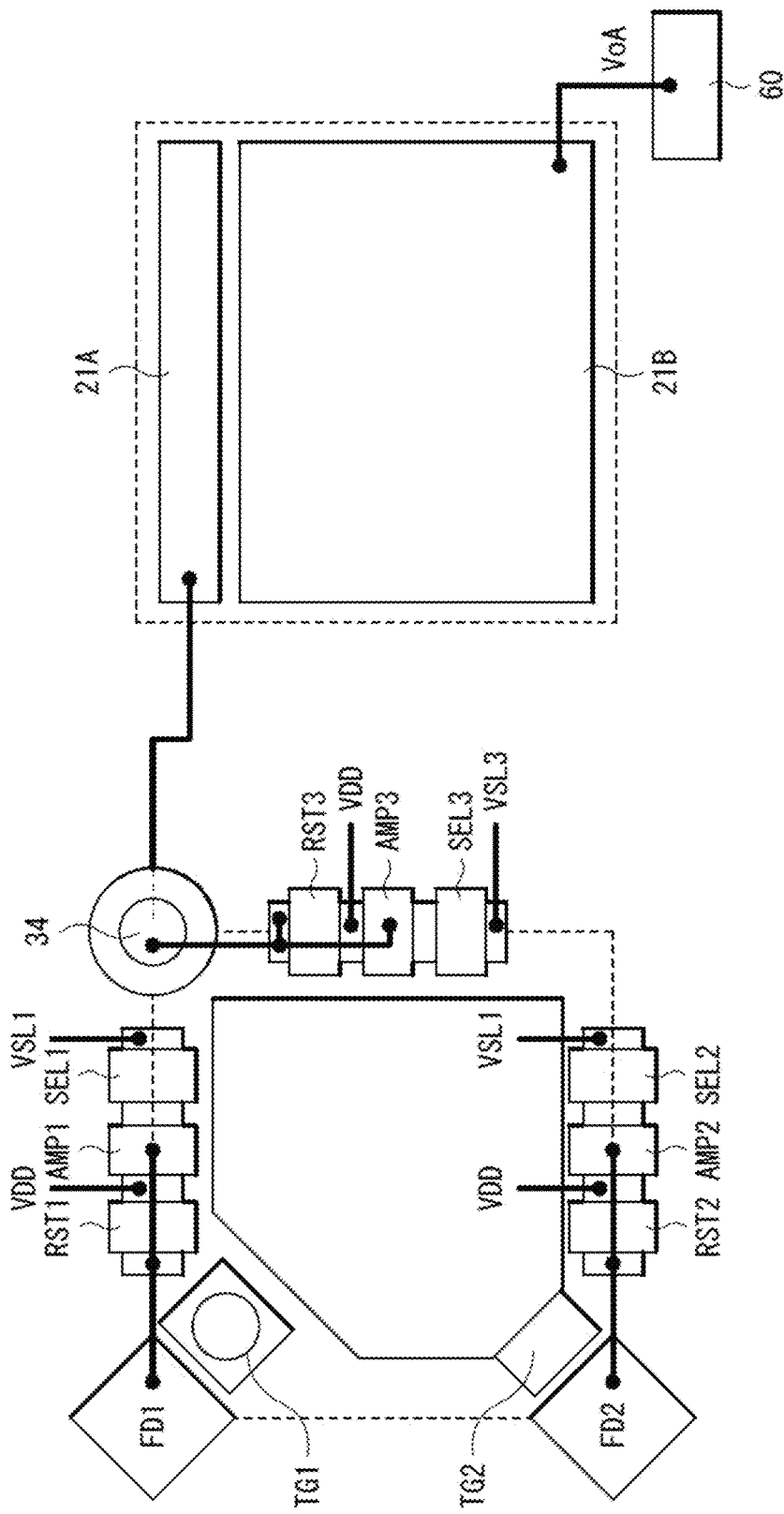

[FIG. 5]
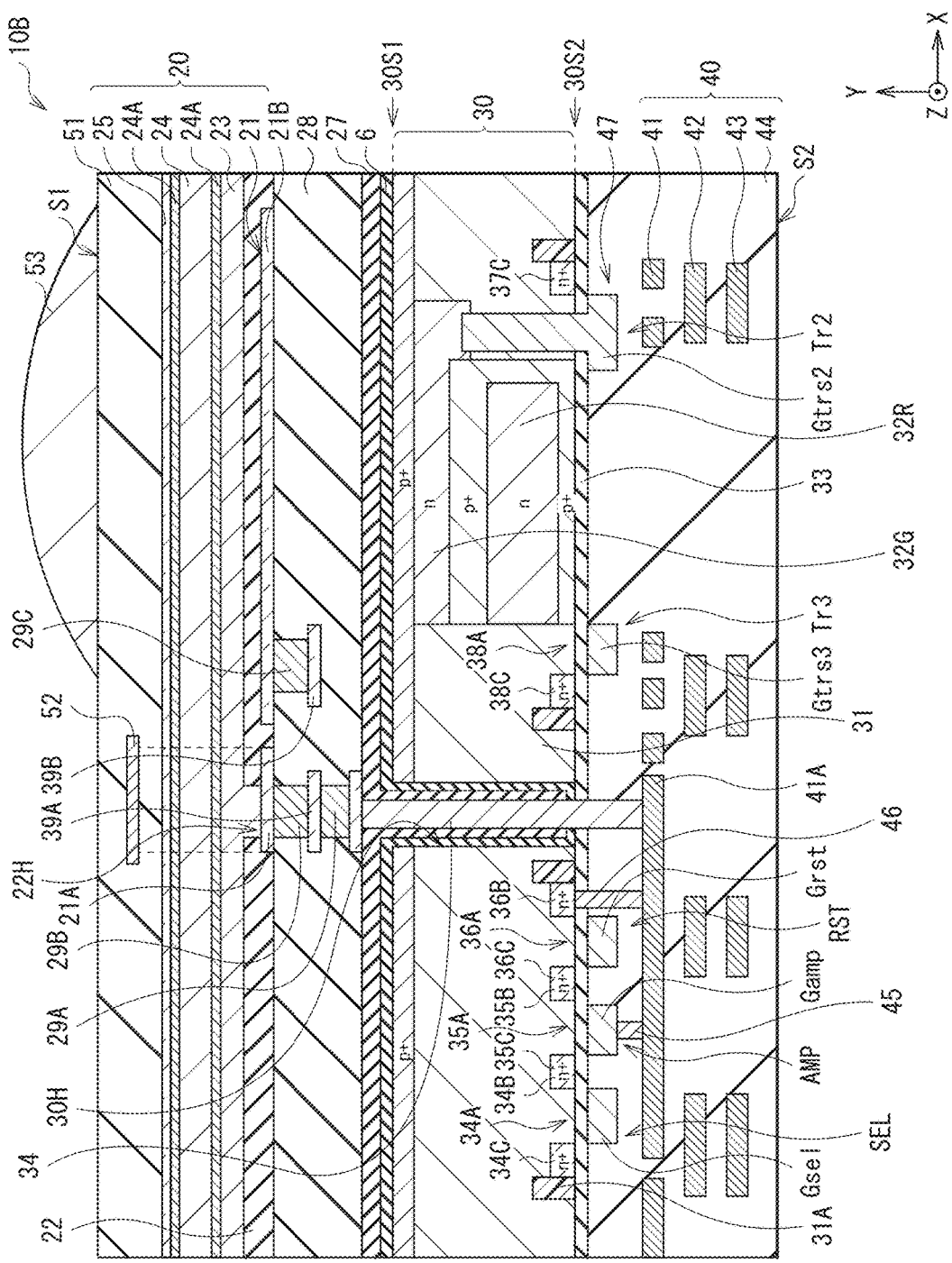

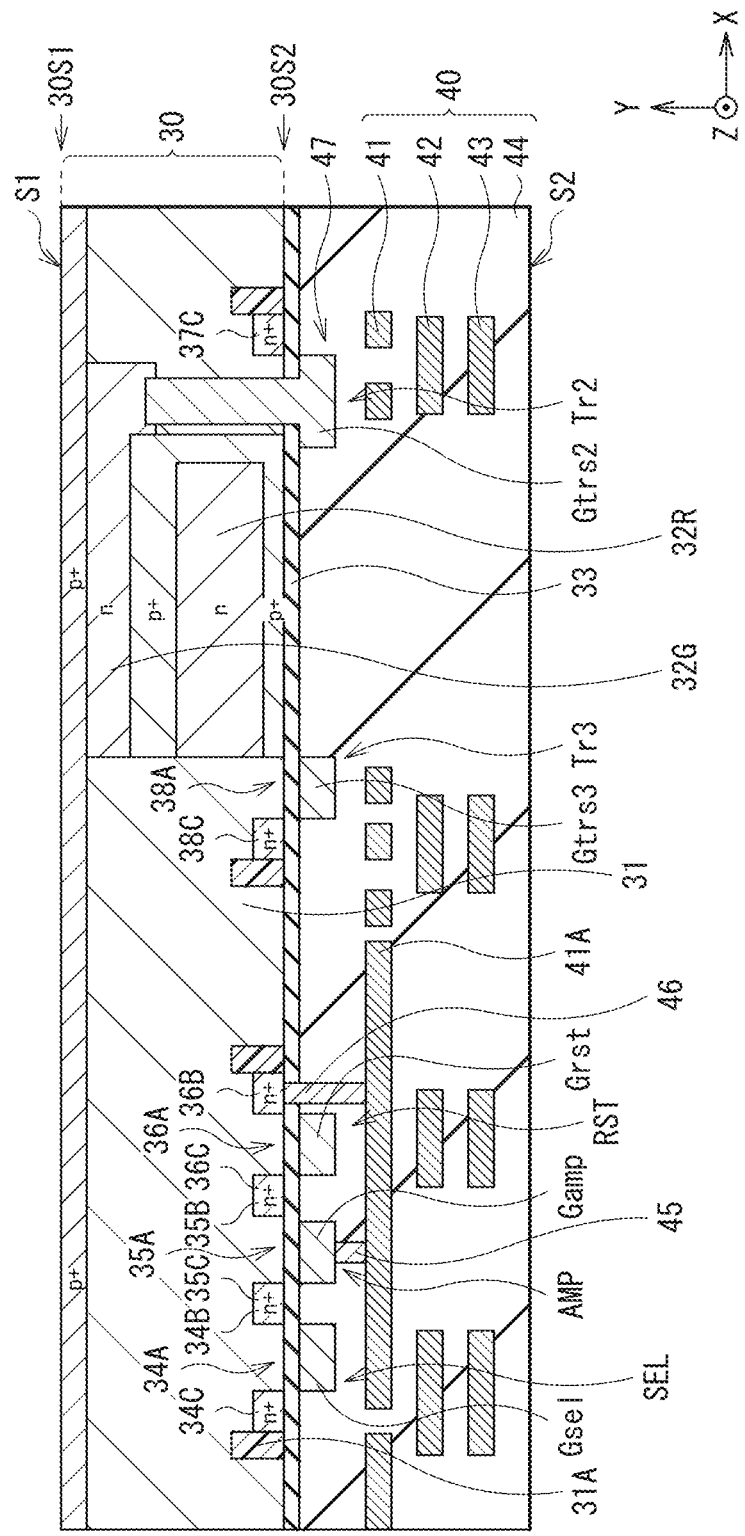
[FIG. 6]

[FIG. 7]
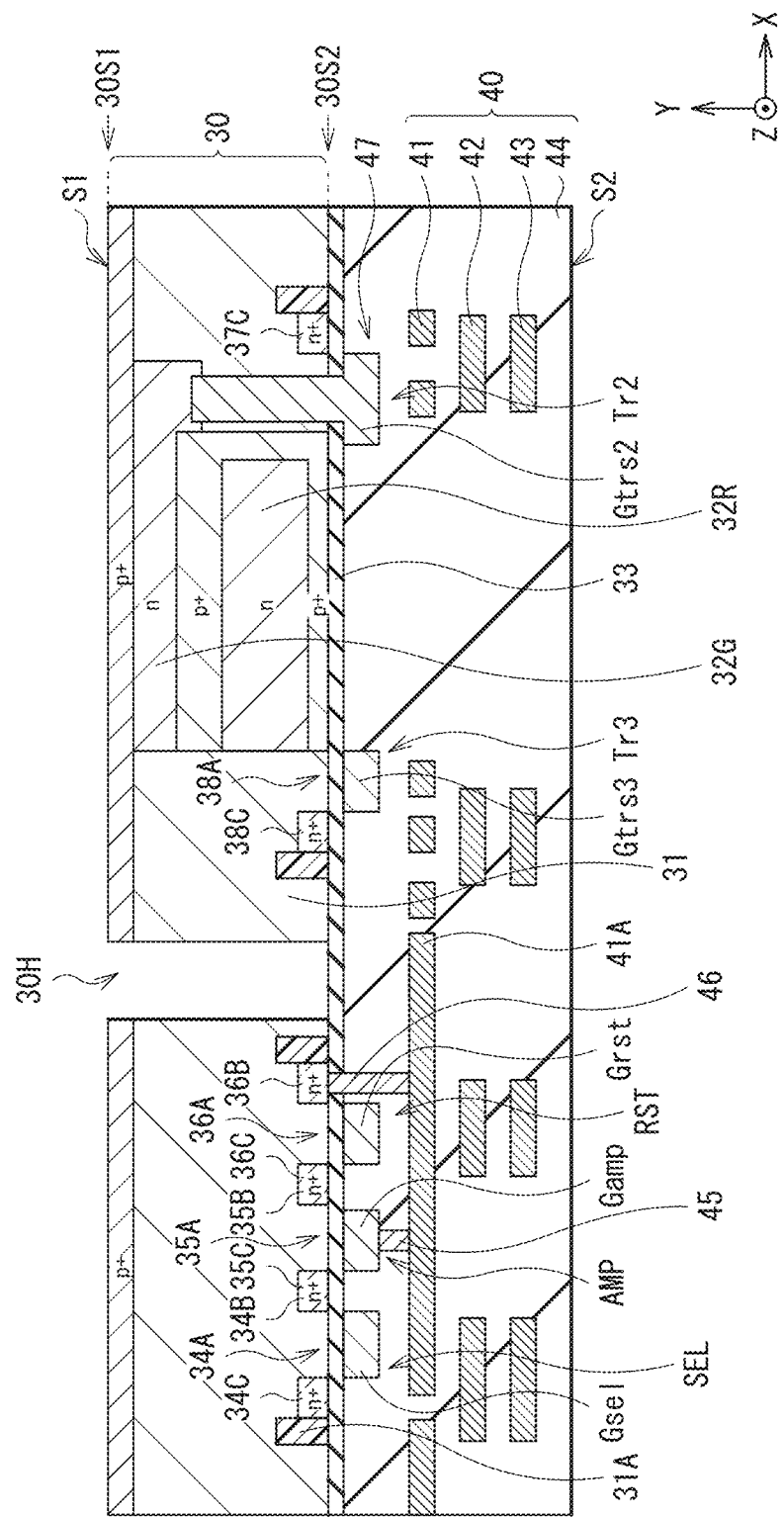

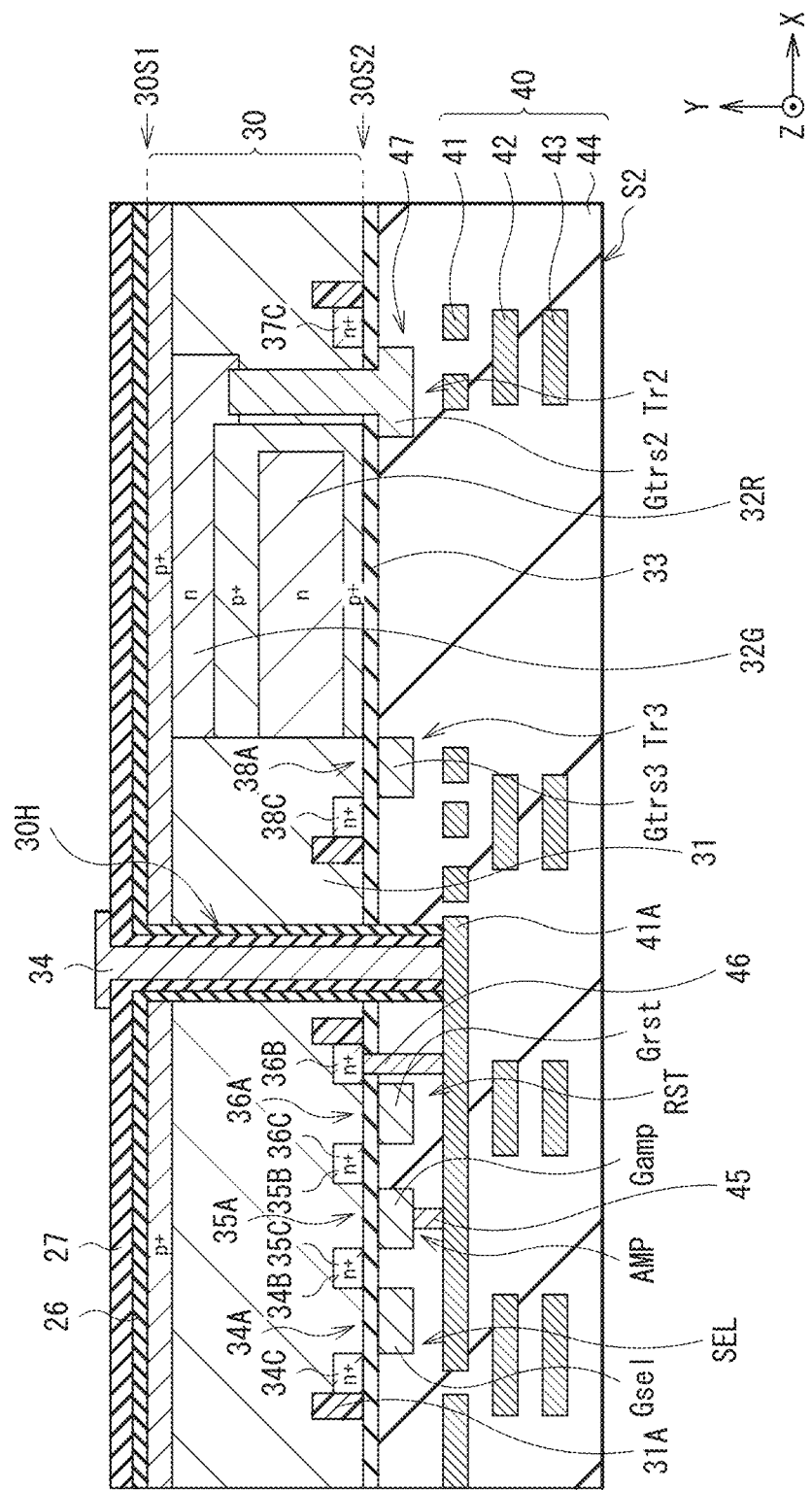
[FIG. 8]

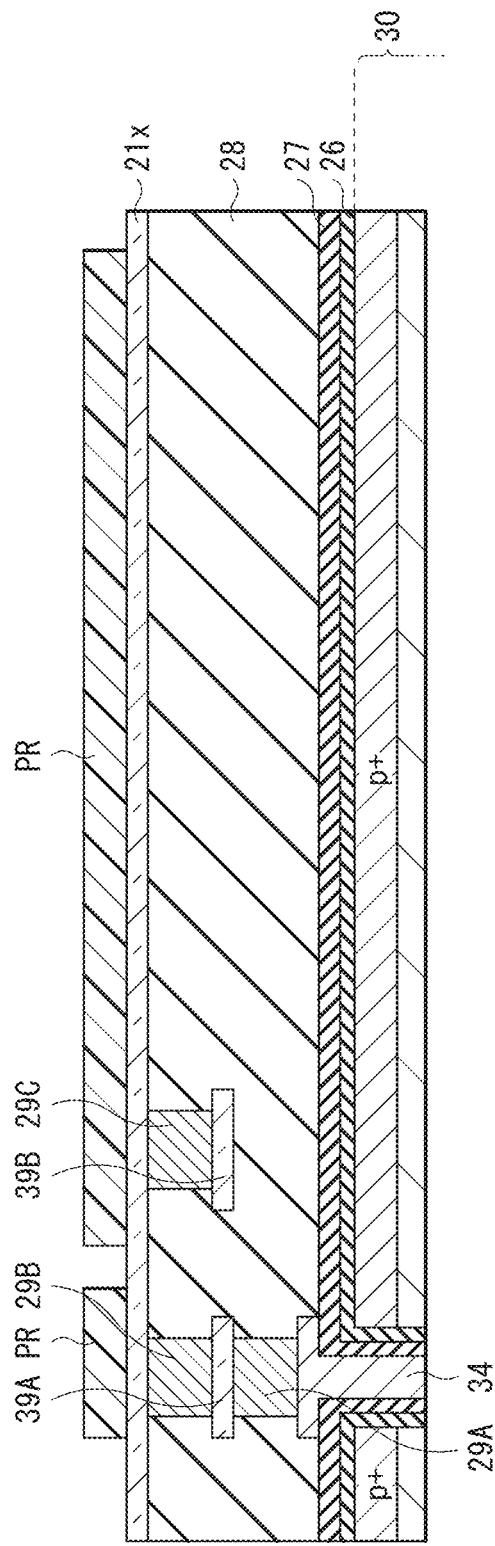

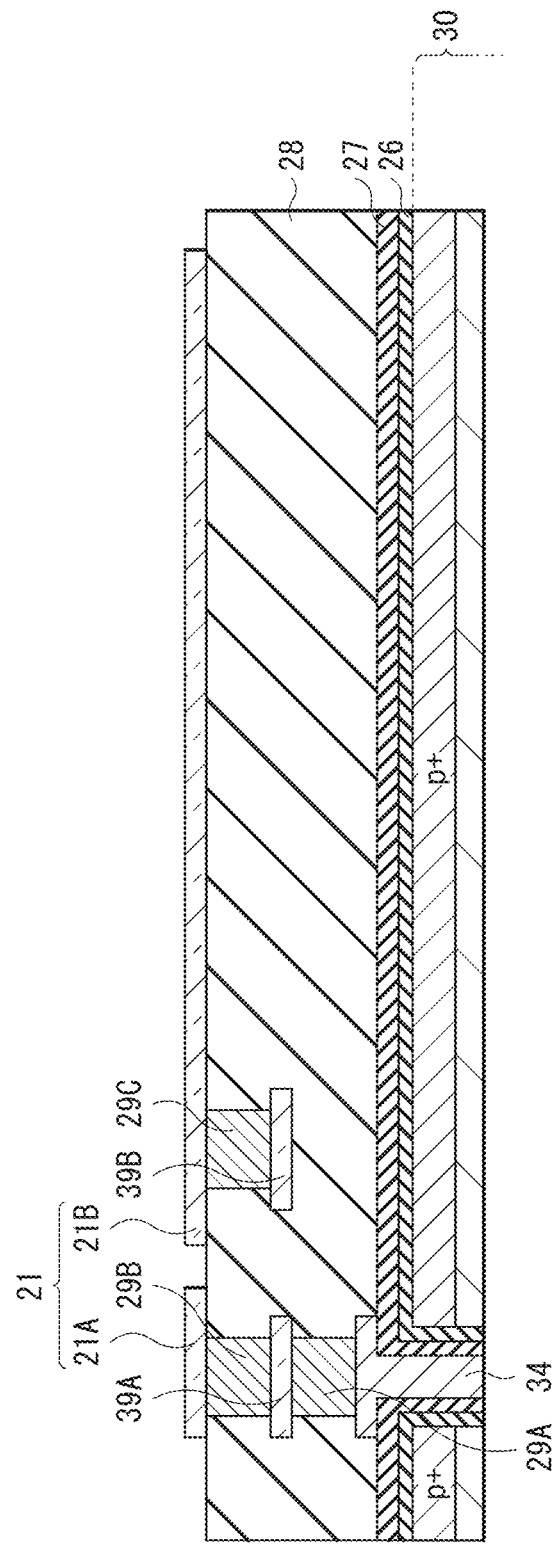
[FIG. 10]

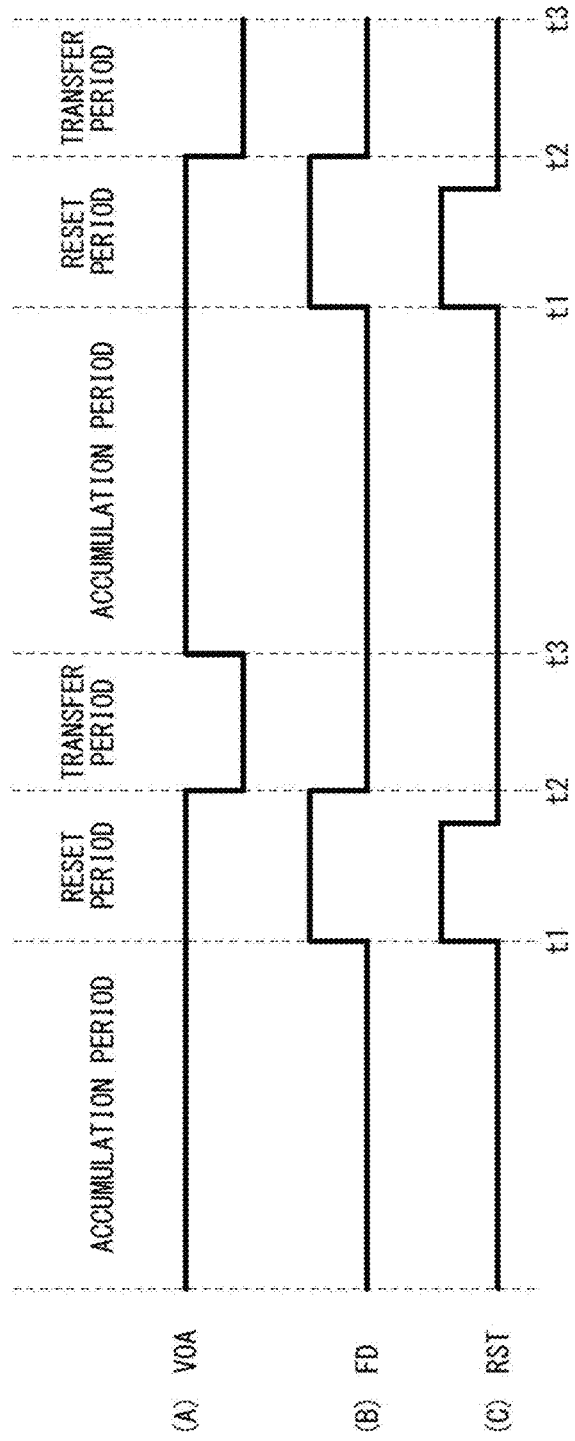

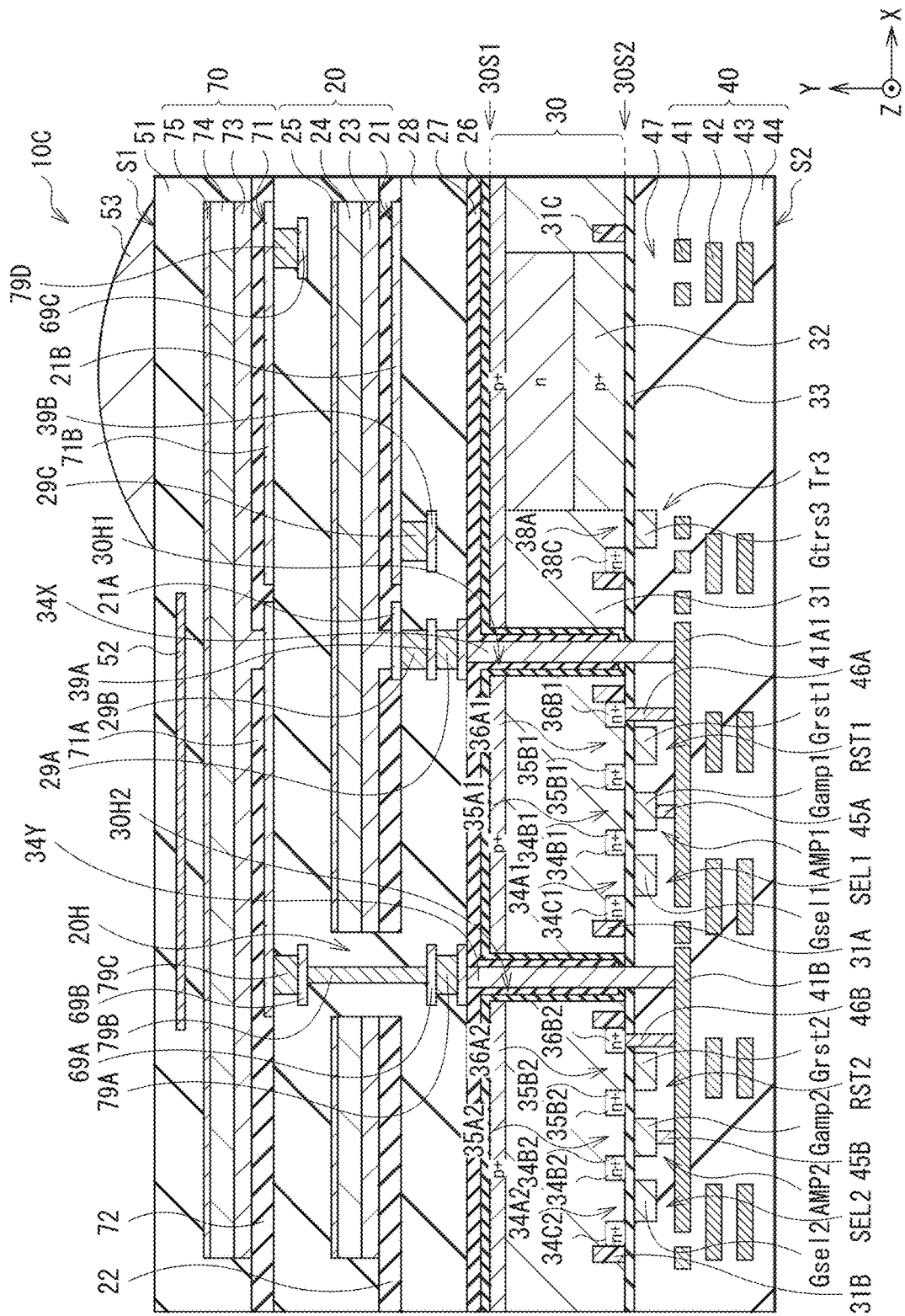
[FIG. 12]

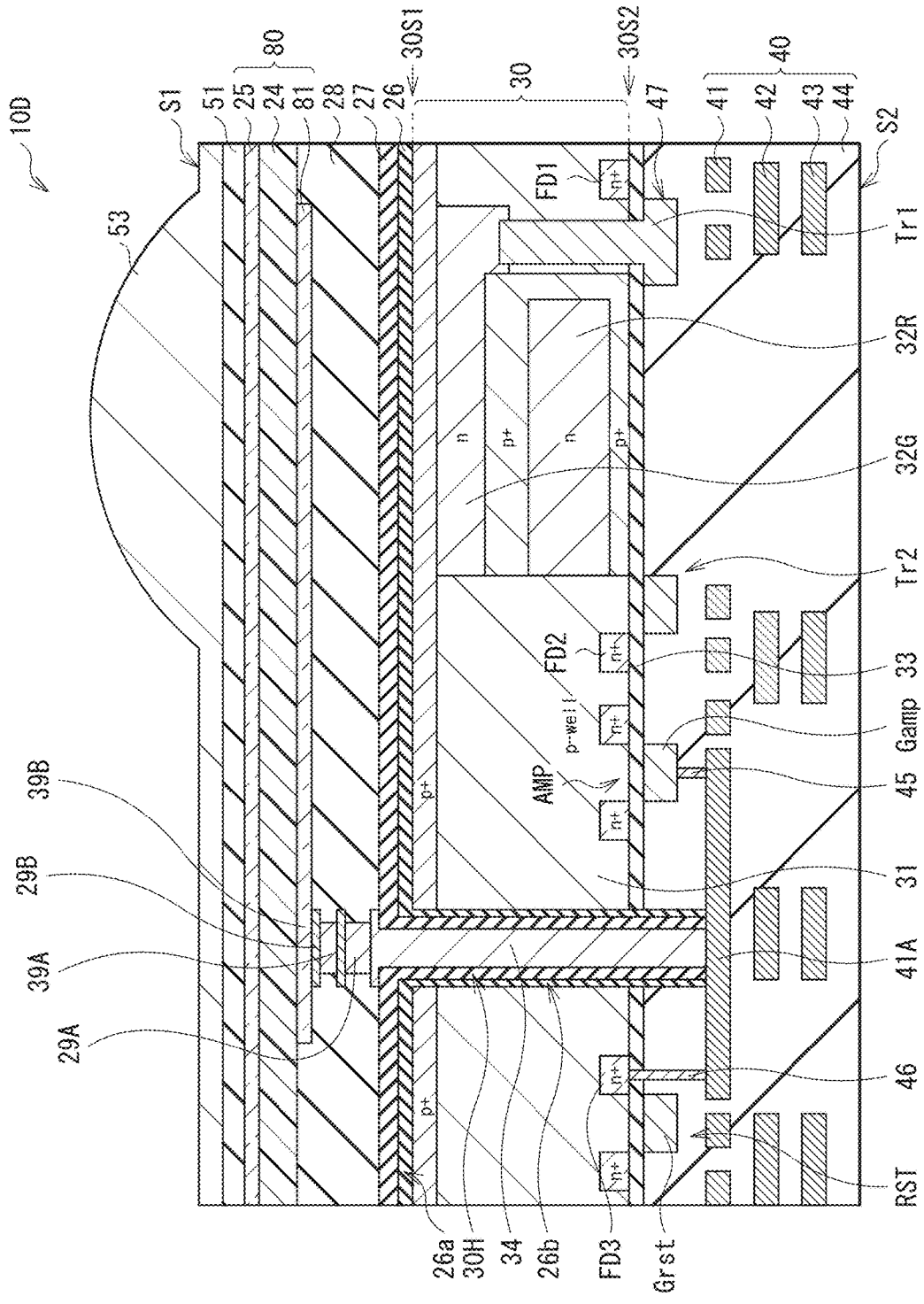
[FIG. 13]

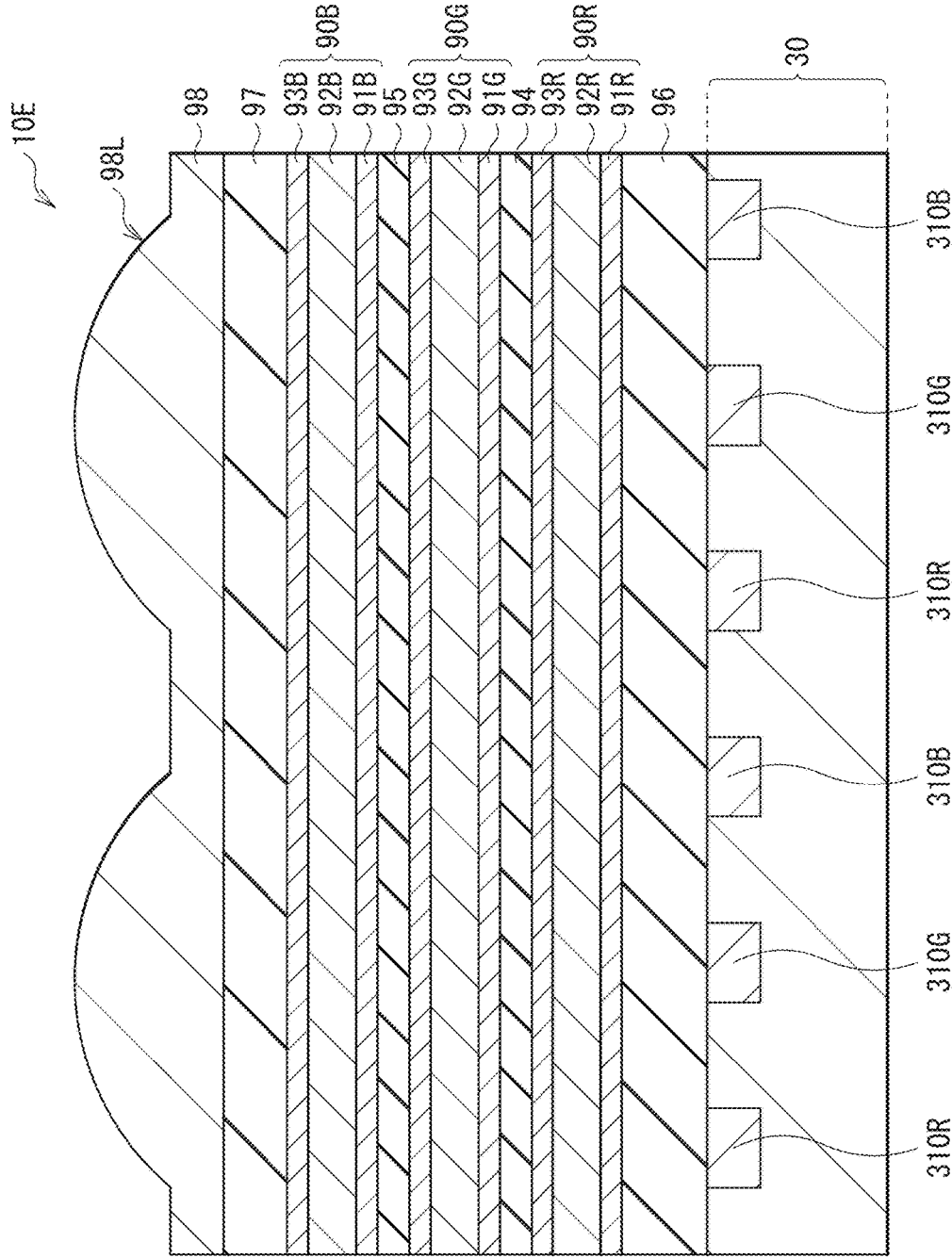

[ FIG. 15 ]
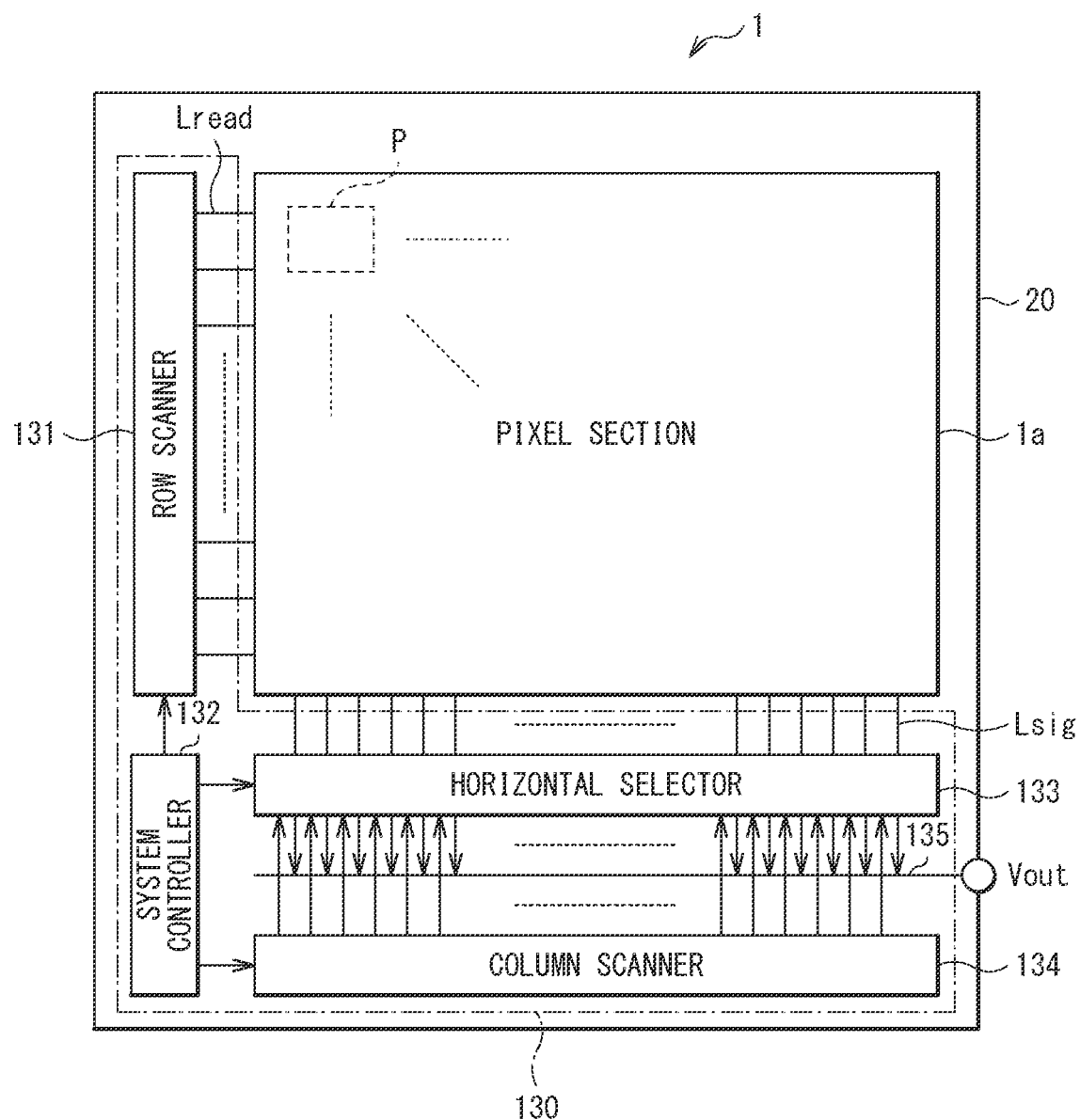

[FIG. 16]
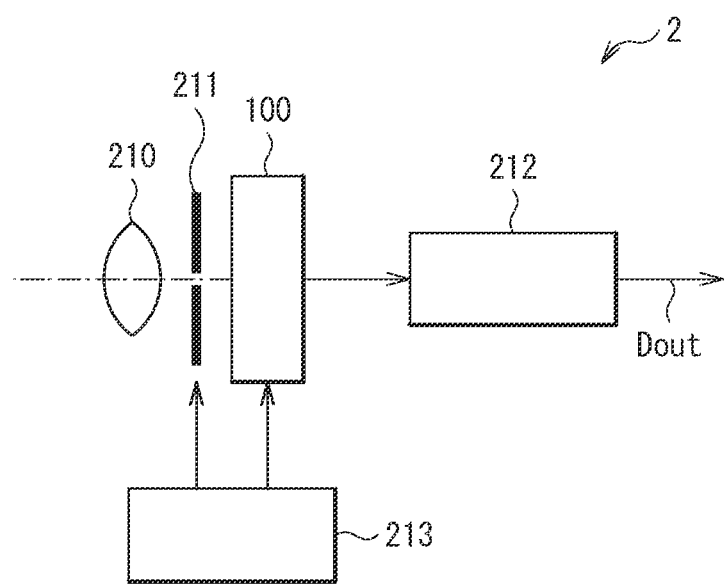

[FIG. 17]
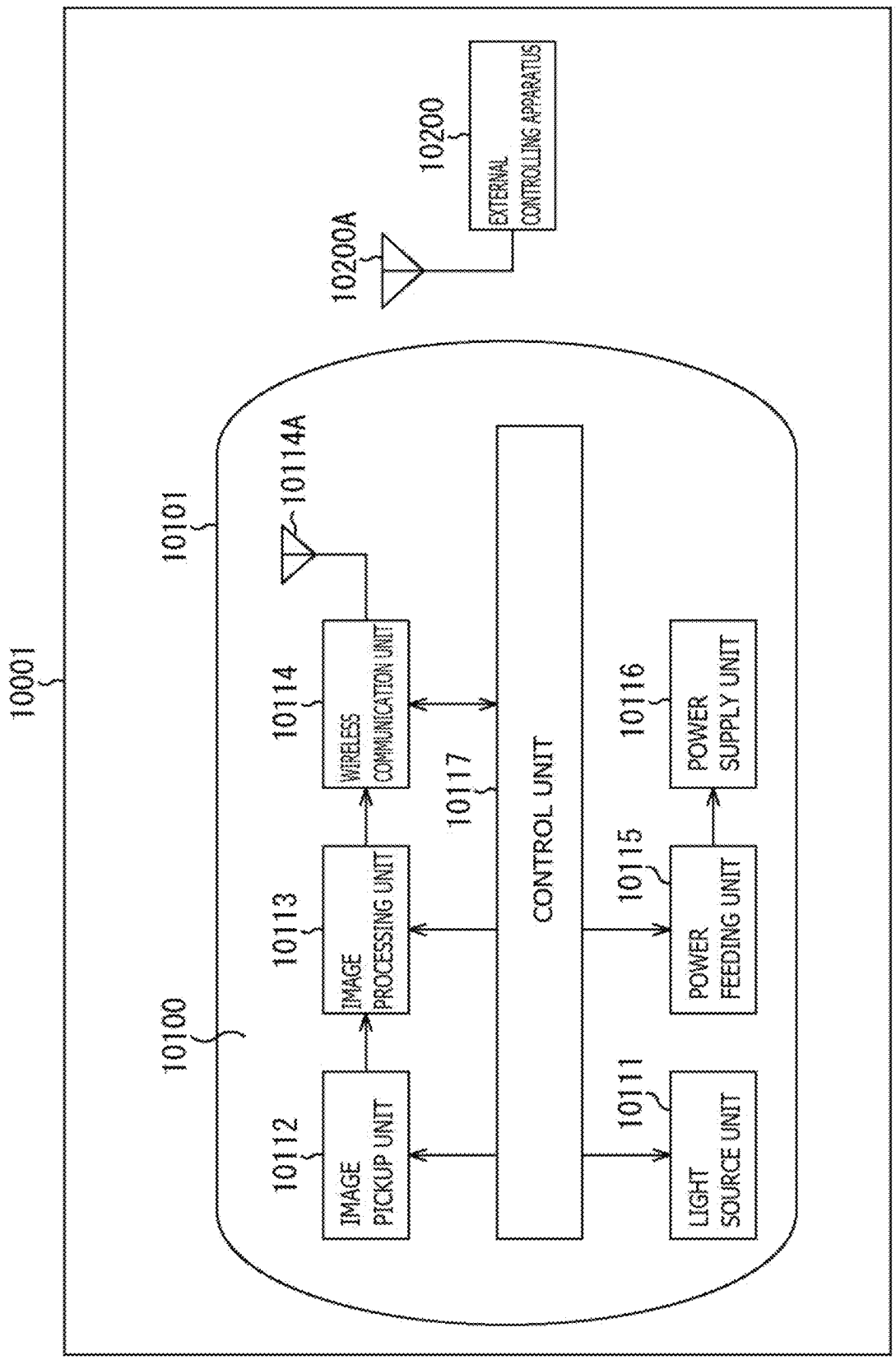

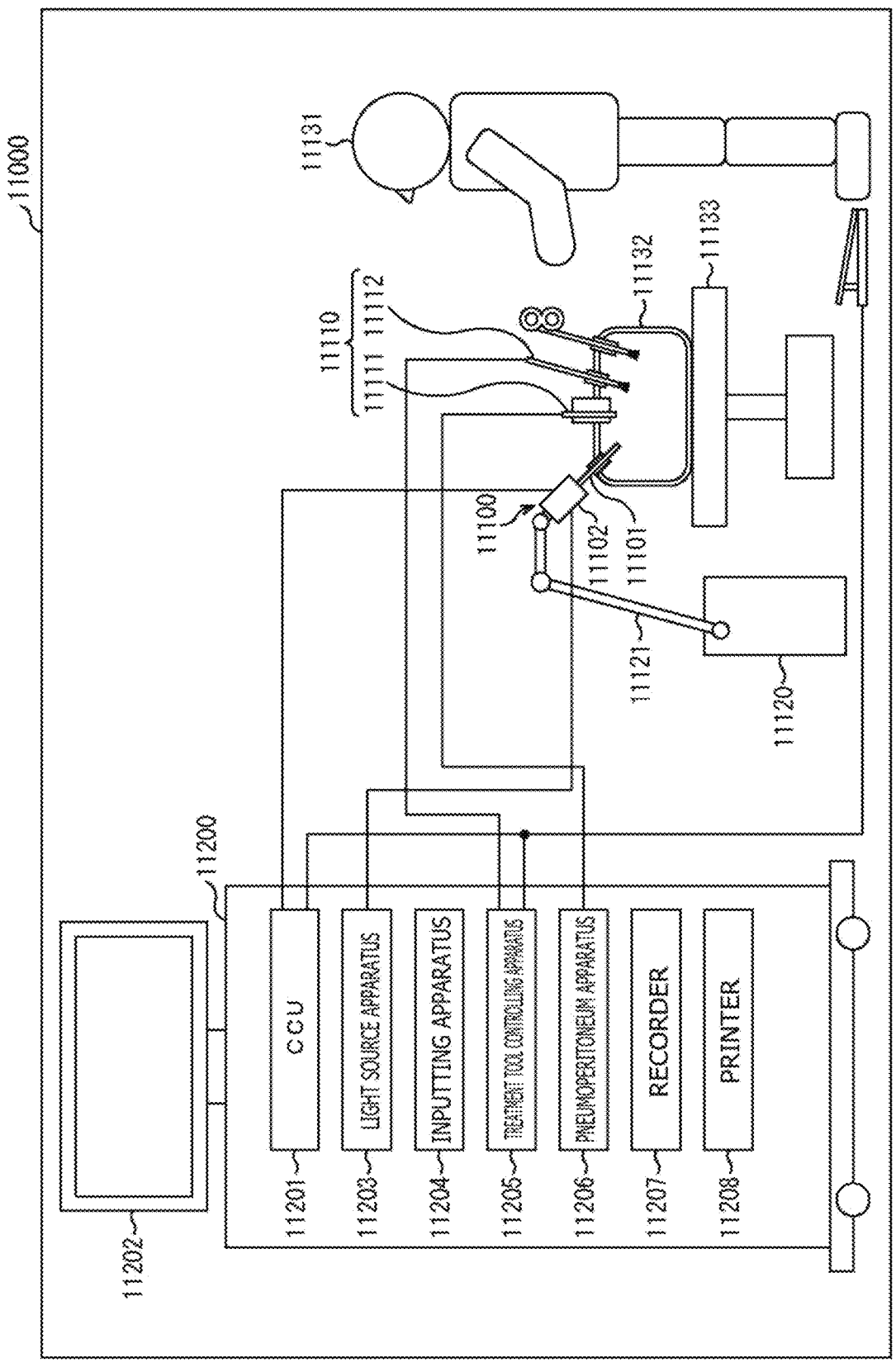

[FIG. 19]
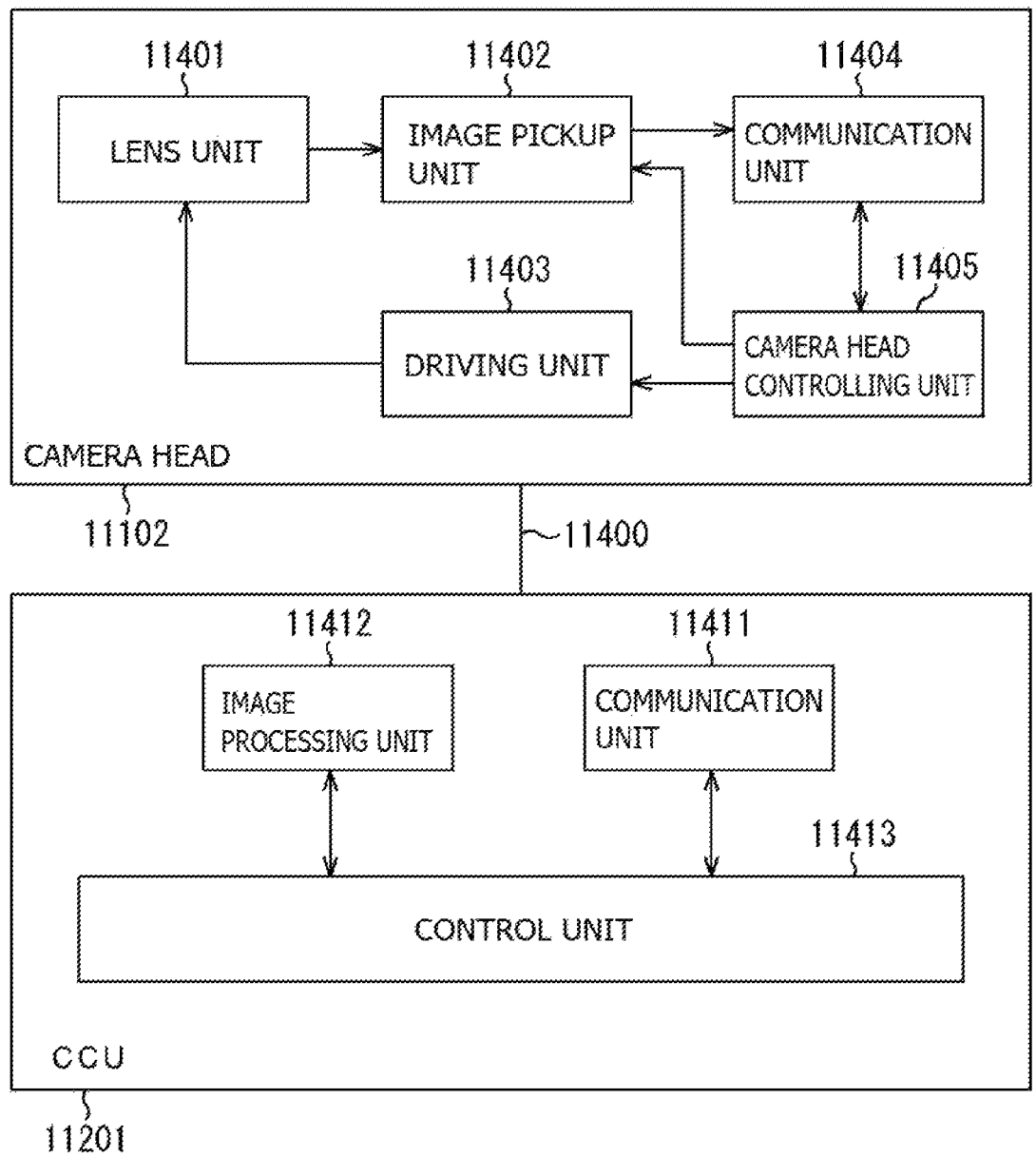

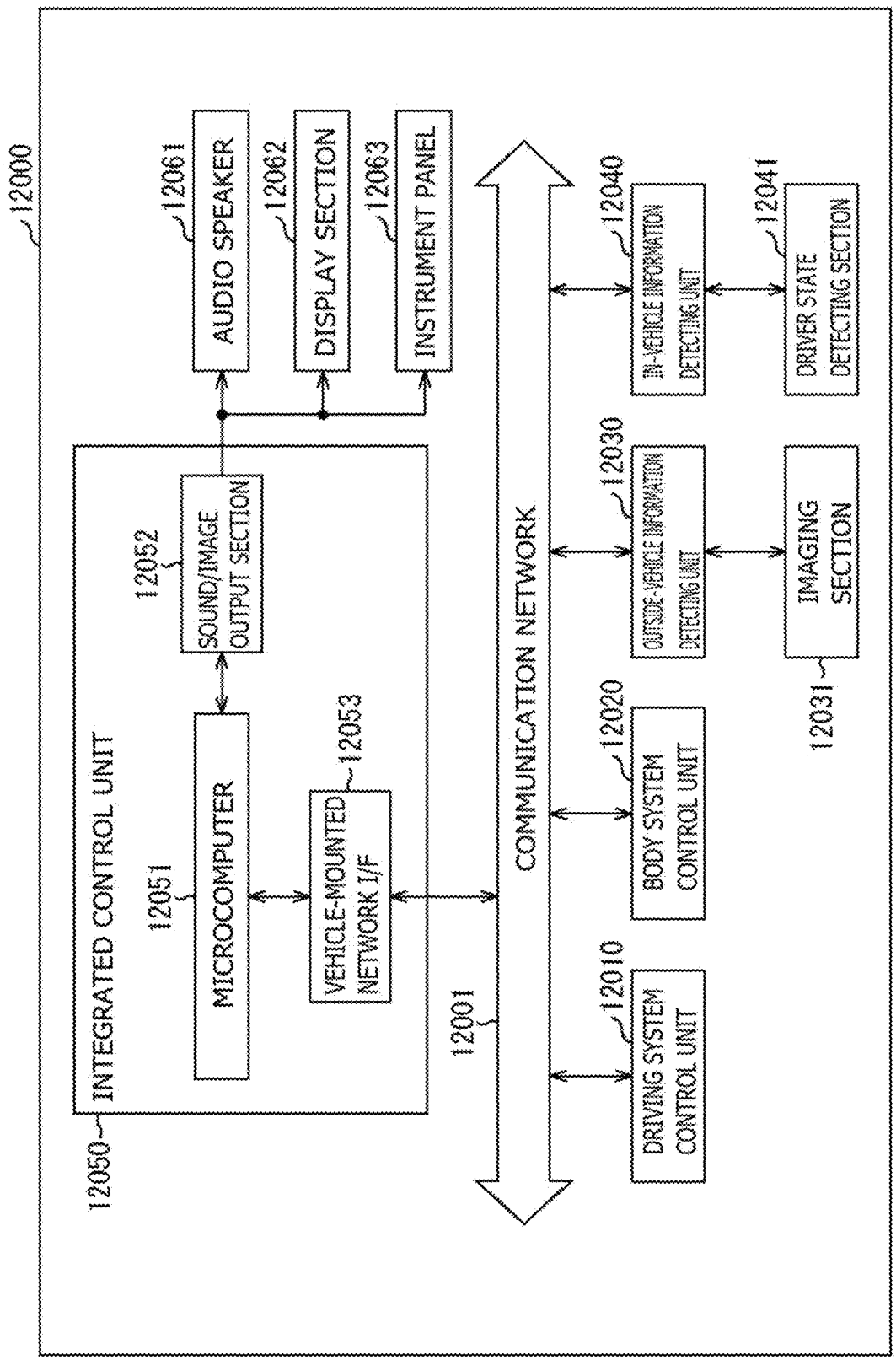

[ FIG. 21 ]
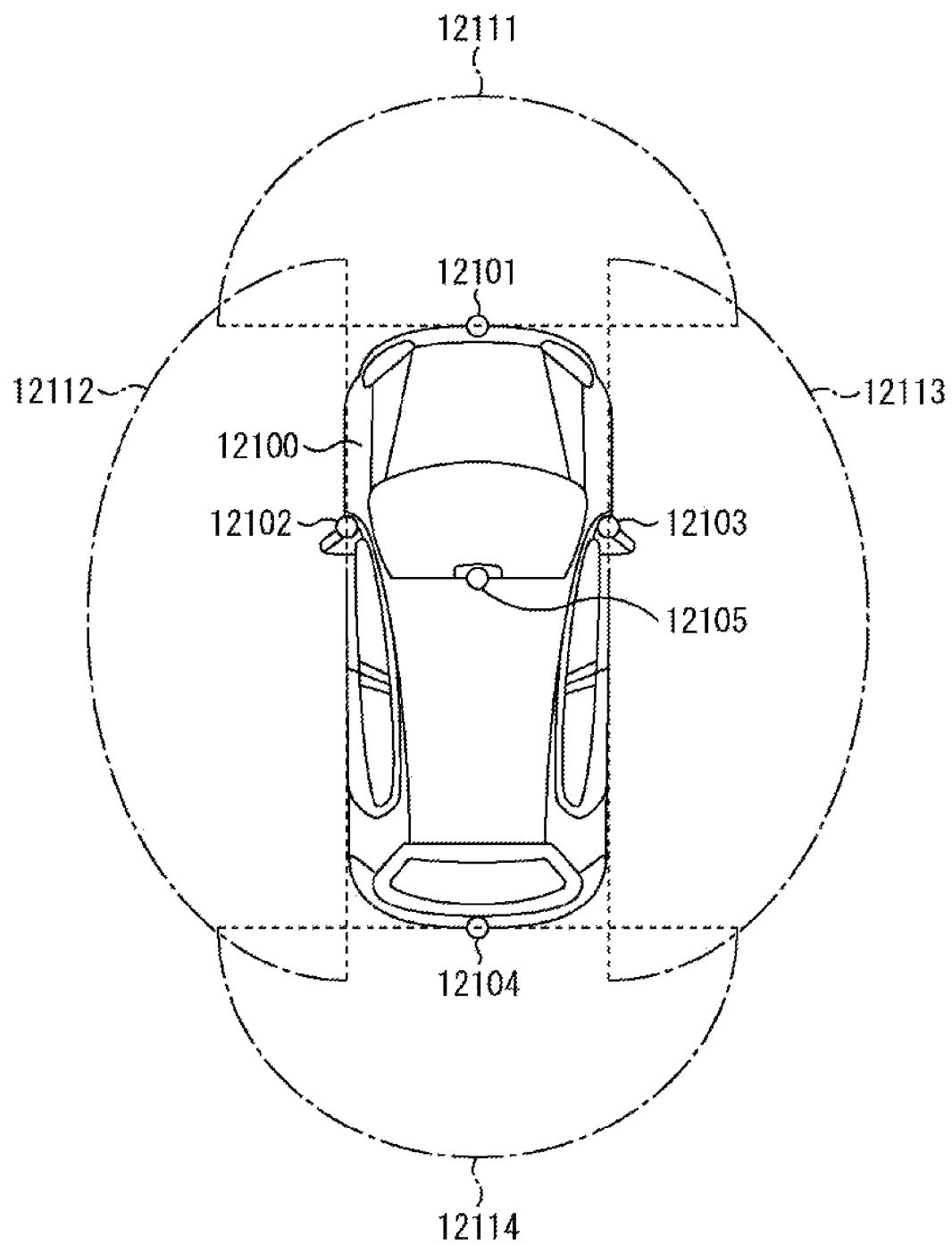

PHOTOELECTRIC CONVERSION ELEMENT AND IMAGING DEVICE

TECHNICAL FIELD

The present disclosure relates to, for example, a photoelectric conversion element using an organic material and an imaging device including the same.

BACKGROUND ART

For example, PTL 1 and NPTL 1 have reported that, for example, a combination of a coumarin dye and fullerene is used as a material of a photoelectric conversion layer that absorbs blue light and performs photoelectric conversion of the blue light.

CITATION LIST

Patent Literature

PTL 1: Japanese Unexamined Patent Application Publication No. 2012-129276

Non-Patent Literature

NPTL 1: Jpn. J. Appl. Phys., Vol. 49, No. 11, pp. 111601.1-11601.4 (2010)

SUMMARY OF THE INVENTION

Incidentally, development of a photoelectric conversion element having high external quantum efficiency and high optical responsivity is desired.

It is desirable to provide a photoelectric conversion element and an imaging device that make it possible to improve external quantum efficiency and optical responsivity.

A photoelectric conversion element according to an embodiment of the present disclosure includes: a first electrode; a second electrode that is opposed to the first electrode; and an organic photoelectric conversion layer that is provided between the first electrode and the second electrode, and includes, as a first organic semiconductor material, a benzothienobenzothiophene-based compound represented by the following general formula (1).

[Chem. 1]

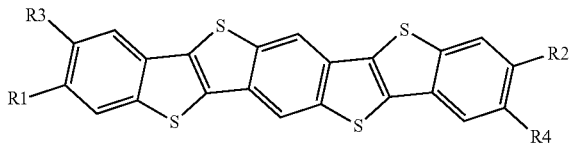

(1)

(R1 to R4 are each independently a phenyl group, a biphenyl group, a terphenyl group, a naphthalene group, a phenylnaphthalene group, a biphenylnaphthalene group, a binaphthalene group, a thiophene group, a bithiophene group, a terthiophene group, a benzothiophene group, a phenyl benzothiophene group, a biphenyl benzothiophene group, a phenyl benzofuran group, a biphenyl benzothiophene group, an alkane group, a cycloalkane group, a fluorene group, a phenylfluorene group, or any of derivatives thereof.)

An imaging device according to an embodiment of the present disclosure includes a plurality of pixels each including one or a plurality of organic photoelectric converters, and includes the photoelectric conversion element according to the embodiment described above as the organic photoelectric converters.

In the photoelectric conversion element according to the embodiment of the present disclosure and the imaging device according to the embodiment of the present disclosure, the organic photoelectric conversion layer is formed by using the benzothienobenzothiophene-based compound represented by the general formula (1) described above. This leads to an improvement in carrier mobility to the first electrode and the second electrode that are opposed to each other with the organic photoelectric conversion layer interposed therebetween.

BRIEF DESCRIPTION OF DRAWINGS

FIG. 1 is a schematic cross-sectional view of an example of a configuration of an imaging element according to a first embodiment of the present disclosure.

FIG. 2 is a diagram illustrating an entire configuration of the imaging element illustrated in FIG. 1.

FIG. 3 is an equivalent circuit diagram of the imaging element illustrated in FIG. 1.

FIG. 4 is a schematic view of a layout of a lower electrode and transistors included in a controller in the imaging element illustrated in FIG. 1.

FIG. 5 is a schematic cross-sectional view of another example of the configuration of the imaging element according to the first embodiment of the present disclosure.

FIG. 6 is a cross-sectional view for describing a method of manufacturing the imaging element illustrated in FIG. 1.

FIG. 7 is a cross-sectional view of a process subsequent to FIG. 6.

FIG. 8 is a cross-sectional view of a process subsequent to FIG. 7.

FIG. 9 is a cross-sectional view of a process subsequent to FIG. 8.

FIG. 10 is a cross-sectional view of a process subsequent to FIG. 9.

FIG. 11 is a timing chart illustrating an operation example of the imaging element illustrated in FIG. 1.

FIG. 12 is a schematic cross-sectional view of an example of a configuration of an imaging element according to a second embodiment of the present disclosure.

FIG. 13 is a schematic cross-sectional view of an example of a configuration of an imaging element according to a third embodiment of the present disclosure.

FIG. 14 is a schematic cross-sectional view of an example of a configuration of an imaging element according to a fourth embodiment of the present disclosure.

FIG. 15 is a block diagram illustrating a configuration of an imaging device using the imaging element illustrated in FIG. 1 and the like for a pixel.

FIG. 16 is a functional block diagram illustrating an electronic apparatus (camera) using the imaging device illustrated in FIG. 15.

FIG. 17 is a block diagram depicting an example of a schematic configuration of an in-vivo information acquisition system.

FIG. 18 is a view depicting an example of a schematic configuration of an endoscopic surgery system.

FIG. 19 is a block diagram depicting an example of a functional configuration of a camera head and a camera control unit (CCU).

FIG. 20 is a block diagram depicting an example of schematic configuration of a vehicle control system.

FIG. 21 is a diagram of assistance in explaining an example of installation positions of an outside-vehicle information detecting section and an imaging section.

MODES FOR CARRYING OUT THE INVENTION

In the following, some embodiments of the present disclosure are described in detail with reference to the drawings. The following description is given of specific examples of the present disclosure, and the present disclosure is not limited to the following embodiments. Moreover, the present disclosure is not limited to positions, dimensions, dimension ratios, and the like of respective components illustrated in the respective drawings. It is to be noted that description is given in the following order.

1. First Embodiment
(An example of a photoelectric conversion element including a photoelectric conversion layer that includes a benzothienobenzothiophene-based compound)
 1-1. Configuration of Imaging Element
 1-2. Method of Manufacturing Imaging Element
 1-3. Workings and Effects
2. Second Embodiment (An example in which two organic photoelectric converters are stacked on a semiconductor substrate)
3. Third Embodiment (An example in which a lower electrode includes an organic photoelectric converter formed with a solid film)
4. Fourth Embodiment (An example in which three organic photoelectric converters are stacked on a semiconductor substrate)
5. Application Examples
6. Practical Application Examples
7. Examples

1. First Embodiment

FIG. 1 illustrates an example of a cross-sectional configuration of an imaging element (an imaging element 10A) according to a first embodiment of the present disclosure. FIG. 2 illustrates a planar configuration of the imaging element 10A illustrated in FIG. 1. FIG. 3 is an equivalent circuit diagram of the imaging element 10A illustrated in FIG. 1, and corresponds to a region 100 illustrated in FIG. 2. FIG. 4 schematically illustrates a layout of a lower electrode 21 and transistors included in a controller in the imaging element 10A illustrated in FIG. 1. The imaging element 10A is included, for example, in one pixel (a unit pixel P) of an imaging device (an imaging device 1; see FIG. 17) such as a CMOS (Complementary Metal Oxide Semiconductor) image sensor used for an electronic apparatus such as a digital still camera and a video camera. The imaging element 10A according to the present embodiment includes an organic photoelectric converter 20 in which the lower electrode 21, a photoelectric conversion layer 24, and an upper electrode 25 are stacked in this order. The photoelectric conversion layer 24 is formed by using a benzothienobenzothiophene-based compound represented by a general formula (1) to be described later. The organic photoelectric converter 20 corresponds to a specific example of a "photoelectric conversion element" of the present disclosure.

(1-1. Configuration of Imaging Element)

The imaging element 10A is of a so-called longitudinal spectral type in which one organic photoelectric converter 20 and two inorganic photoelectric converters 32G and 32R are stacked in a longitudinal direction. The organic photoelectric converter 20 is provided on a first surface (a back surface; a surface 30S1) side of a semiconductor substrate 30. The inorganic photoelectric converters 32G and 32R are formed to be embedded in the semiconductor substrate 30, and are stacked in a thickness direction of the semiconductor substrate 30. The organic photoelectric converter 20 includes a photoelectric conversion layer 24 between the lower electrode 21 and the upper electrode 25 that are opposed to each other, as described above. The photoelectric conversion layer 24 is formed by using an organic material. The photoelectric conversion layer 24 includes a p-type semiconductor and an n-type semiconductor, and has a bulk heterojunction structure in a layer. The bulk heterojunction structure is a p/n junction surface that is formed by mixing the p-type semiconductor and the n-type semiconductor.

The organic photoelectric converter 20 and the inorganic photoelectric converters 32G and 32R each selectively detect light in a corresponding one of wavelength bands different from each other, and perform photoelectric conversion of the thus-detected light. For example, the organic photoelectric converter 20 acquires a blue (B) color signal. The inorganic photoelectric converters 32G and 32R respectively acquire a green (G) color signal and a red (R) color signal by a difference in absorption coefficient. This allows the imaging element 10A to acquire a plurality of kinds of color signals in one pixel without using a color filter.

It is to be noted that, in the present embodiment, description is given of a case where electrons of pairs of electrons and holes (electron-hole pairs) generated by photoelectric conversion are read as signal electric charges (in a case where an n-type semiconductor region serves as a photoelectric conversion layer). In addition, in the drawings, "+ (plus)" attached to "p" or "n" indicates that p-type or n-type impurity concentration is high.

For example, floating diffusions (floating diffusion layers) FD1 (a region 36B in the semiconductor substrate 30), FD2 (a region 37C in the semiconductor substrate 30), and FD3 (a region 38C in the semiconductor substrate 30), transfer transistors Tr2 and Tr3, an amplifier transistor (a modulation element) AMP, a reset transistor RST, a selection transistor SEL, and multilayer wiring 40 are provided on a second surface (a front surface; 30S2) of the semiconductor substrate 30. The multilayer wiring 40 has, for example, a configuration in which wiring layers 41, 42, and 43 are stacked in an insulating layer 44.

It is to be noted that in the drawing, the first surface (the surface 30S1) side of the semiconductor substrate 30 is represented as a light incident side S1 and the second surface (the surface 30S2) side of the semiconductor substrate 30 is represented as a wiring layer side S2.

The organic photoelectric converter 20 includes the lower electrode 21, the semiconductor layer 23, the photoelectric conversion layer 24, and the upper electrode 25 that are stacked in this order from the first surface (the surface 30S1) side of the semiconductor substrate 30. In addition, an insulating layer 22 is provided between the lower electrode 21 and the semiconductor layer 23. The lower electrode 21 is formed separately for each imaging element 10A, for example, and includes a readout electrode 21A and an accumulation electrode 21B that are separated from each other with the insulating layer 22 interposed therebetween as described in detail later. The readout electrode 21A of the lower electrode 21 is electrically coupled to the semiconductor layer 23 via an opening 22H provided in the insulating layer 22. FIG. 1 illustrates an example in which the semiconductor layer 23, the photoelectric conversion layer 24, and the upper electrode 25 are provided as common continuous layers for a plurality of imaging elements 10A, but the semiconductor layer 23, the photoelectric conversion layer 24, and the upper electrode 25 may be formed separately for each imaging element 10A, for example. For example, a dielectric film 26, an insulating film 27, and an interlayer insulating layer 28 are provided between the first surface (the surface 30S1) of the semiconductor substrate 30 and the lower electrode 21. A protective layer 51 is provided on the upper electrode 25. A light-shielding film 52 is provided, for example, at a position corresponding to the readout electrode 21A in the protective layer 51. It is sufficient if the light-shielding film 52A is provided to cover at least a region of the readout electrode 21A directly in contact with the semiconductor layer 23 without covering at least the accumulation electrode 21B. Optical members such a planarization layer (not illustrated) and an on-chip lens 53 are provided above the protective layer 51.

A through electrode 34 is provided between the first surface (the surface 30S1) and the second surface (the surface 30S2) of the semiconductor substrate 30. The through electrode 34 is electrically coupled to the readout electrode 21 of the organic photoelectric converter 20, and the organic photoelectric converter 20 is coupled to a gate Gamp of the amplifier transistor AMP and one source/drain region 36B, which also serves as the floating diffusion FD1, of the reset transistor RST (a reset transistor Tr1rst) via the through electrode 34. This makes it possible to favorably transfer electric charges generated in the organic photoelectric converter 20 on the first surface (the surface 30S21) side of the semiconductor substrate 30 to the second surface (the surface 30S2) side of the semiconductor substrate 30 and enhance characteristics in the imaging element 10A.

A lower end of the through electrode 34 is coupled to a coupling section 41A in the wiring layer 41, and the coupling section 41A and the gate Gamp of the amplifier transistor AMP are coupled to each other via a first lower contact 45. The coupling section 41A and the floating diffusion FD1 (the region 36B) are coupled to each other via a second lower contact 46, for example. An upper end of the through electrode 34 is coupled to the readout electrode 21A via a first upper contact 29A, a pad section 39A, and a second upper contact 29B, for example.

The through electrode 34 is provided for each organic photoelectric converter 20 in each of the imaging elements 10A, for example. The through electrode 34 has a function as a connector between the organic photoelectric converter 20 and both the gate Gamp of the amplifier transistor AMP and the floating diffusion FD1, and serves as a transmission path of electric charges generated in the organic photoelectric converter 20.

A reset gate Grst of the reset transistor RST is disposed adjacent to the floating diffusion FD1 (the one source/drain region 36B of the reset transistor RST). This makes it possible to reset electric charges accumulated in the floating diffusion FD1 by the reset transistor RST.

In the imaging element 10A according to the present embodiment, light having entered the organic photoelectric converter 20 from the upper electrode 25 side is absorbed by the photoelectric conversion layer 24. Excitons thereby generated move to an interface between an electron donor and an electron acceptor included in the photoelectric conversion layer 24, and the excitons are dissociated, that is, the excitons are dissociated into electrons and holes. Electric charges generated herein (electrons and holes) are each carried to different electrodes by diffusion resulting from a difference in concentration between carriers or an internal electric field resulting from a difference in work function between an anode (for example, the upper electrode 25) and a cathode (for example, the lower electrode 21), and detected as a photocurrent. Moreover, it is also possible to control transport directions of the electrons and the holes by application of a potential between the lower electrode 21 and the upper electrode 25.

In the following, description is given of the configurations, materials, and the like of respective components.

The organic photoelectric converter 20 is an organic photoelectric conversion element that absorbs light corresponding to a wavelength band of a portion or the entirety of a selective wavelength band (for example, from 400 nm to 700 nm both inclusive) to generate electron-hole pairs.

The lower electrode 21 includes the readout electrode 21A and the accumulation electrode 21B that are separately formed as described above. The readout electrode 21A transfers electric charges generated in the photoelectric conversion layer 24 to the floating diffusion FD1, and is coupled to the floating diffusion FD1 via the second upper contact 29B, the pad section 39A, the first upper contact 29A, the through electrode 34, the coupling section 41A, and the second lower contact 46, for example. The accumulation electrode 21B accumulates, in the semiconductor layer 23, electrons as signal electric charges of the electric charges generated in the photoelectric conversion layer 24. The accumulation electrode 21B is directly opposed to light reception surfaces of the inorganic photoelectric converters 32G and 32R formed in the semiconductor substrate 30, and is provided in a region that covers these light reception surfaces. The accumulation electrode 21B is preferably larger than the readout electrode 21A, which makes it possible to accumulate many electric charges. A voltage application circuit 60 is coupled to the accumulation electrode 21B via wiring as illustrated in FIG. 4.

The lower electrode 21 includes an electrically conductive film having light transmissivity. Examples of a constituent material of the lower electrode 21 include ITO, $In_2O_3$ to which tin (Sn) is added as a dopant, and indium tin oxide including crystalline ITO and amorphous ITO. In addition to the materials described above, a tin oxide ($SnO_2$)-based material to which a dopant is added or a zinc oxide-based material prepared by adding a dopant may be used as the constituent material of the lower electrode 21. Examples of the zinc oxide-based material include aluminum zinc oxide (AZO) to which aluminum (Al) is added as a dopant, gallium zinc oxide (GZO) to which gallium (Ga) is added, boron zinc oxide to which boron (B) is added, and indium zinc oxide (IZO) to which indium (In) is added. In addition, CuI, $InSbO_4$, ZnMgO, $CuInO_2$, $MgIN_2O_4$, CdO, $ZnSnO_3$, $TiO_2$, or the like may be used as the constituent material of the lower electrode 21. Further, a spinel oxide or an oxide having a $YbFe_2O_4$ structure may be used. It is to be noted that the lower electrode 21 formed by using the material as described above generally has a high work function, and functions as an anode electrode.

The semiconductor layer 23 is provided below the photoelectric conversion layer 24, specifically between the insulating layer 22 and the photoelectric conversion layer 24, and accumulate signal electric charges generated in the photoelectric conversion layer 24. The semiconductor layer 23 is preferably formed by using a material having higher electric charge mobility than that of the photoelectric conversion layer 24 and having a large band gap. For example, the band gap of the constituent material of the semiconductor layer 23 is preferably 3.0 eV or greater. Examples of such a material include a oxide semiconductor material such as IGZO, an organic semiconductor material, and the like. Examples of the organic semiconductor material include transition metal dichalcogenide, silicon carbide, diamond, graphene, carbon nanotubes, a condensed polycyclic hydrocarbon compound, a condensed heterocyclic compound, and the like. The semiconductor layer 23 has, for example, a thickness of 10 nm to 300 nm both inclusive. Providing the semiconductor layer 23 including the material described above below the photoelectric conversion layer 24 makes it possible to prevent recombination of electric charges during electric charge accumulation and improve transfer efficiency.

The photoelectric conversion layer 24 converts optical energy into electric energy. The photoelectric conversion layer 24 according to the present embodiment absorbs, for example, light of some or all of wavelengths within a range from 400 nm to 700 nm both inclusive. The photoelectric conversion layer 24 includes, for example, two or more kinds of organic materials (p-type semiconductor materials or n-type semiconductor materials) that each function as a p-type semiconductor or an n-type semiconductor. The photoelectric conversion layer 24 has a junction surface (a p/n junction surface) of the p-type semiconductor material and the n-type semiconductor material in a layer. The p-type semiconductor relatively functions as an electron donor (a donor), and the n-type semiconductor relatively functions as an electron acceptor (an acceptor). The photoelectric conversion layer 24 provides a field where excitons generated upon absorption of light are dissociated into electrons and holes. Specifically, the excitons are dissociated into the electrons and the holes at an interface (the p/n junction surface) between the electron donor and the electron acceptor.

The photoelectric conversion layer 24 may include, in addition to the p-type semiconductor material and the n-type semiconductor material, an organic material, i.e., a so-called dye material, that photoelectrically converts light in a predetermined wavelength band and allows light in another wavelength band to pass therethrough. In a case where the photoelectric conversion layer 24 is formed by using three kinds of organic materials, that is, the p-type semiconductor material, the n-type semiconductor material, and the dye material, the p-type semiconductor material and the n-type semiconductor material are preferably materials having light transmissivity in a visible region (for example, from 400 nm to 700 nm). The thickness of the photoelectric conversion layer 24 is, for example, from 25 nm to 400 nm both inclusive, preferably from 50 nm to 350 nm both inclusive, and more preferably from 150 nm to 300 nm both inclusive.

In the present embodiment, the photoelectric conversion layer 24 is formed by including, for example, a benzothienobenzothiophene-based compound represented by the following general formula (1) that absorbs light of 400 nm to 500 nm both inclusive. The benzothienobenzothiophene-based compound corresponds to a specific example of a "first organic semiconductor material" of the present disclosure.

[Chem. 2]

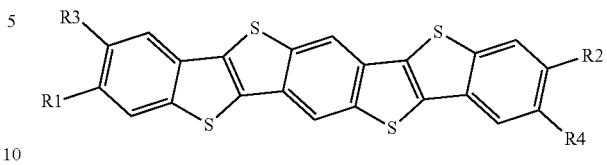

(1)

(R1 to R4 are each independently a phenyl group, a biphenyl group, a terphenyl group, a naphthalene group, a phenylnaphthalene group, a biphenylnaphthalene group, a binaphthalene group, a thiophene group, a bithiophene group, a terthiophene group, a benzothiophene group, a phenyl benzothiophene group, a biphenyl benzothiophene benzofuran group, a phenyl benzofuran group, a biphenyl benzothiophene group, an alkane group, a cycloalkane group, a fluorene group, a phenylfluorene group, or any of derivatives thereof.)

Examples of other organic materials included in the photoelectric conversion layer 24 include fullerene or a fullerene derivative. Fullerene or a fullerene derivative corresponds to a specific example of a "second organic semiconductor material" of the present disclosure.

Furthermore, the photoelectric conversion layer 24 may include, for example, an organic semiconductor material that absorbs any of wavelengths from 400 nm to 700 nm both inclusive. Examples of such a material include a coumarin derivative, a perylene derivative, a porphyrin derivative, a merocyanine derivative, an anthraquinone derivative, and the like. The organic semiconductor material described above corresponds to a specific example of a "third organic semiconductor material" of the present disclosure.

A combination of the organic materials described above function as a p-type semiconductor or an n-type semiconductor depending on the combination.

It is to be noted that the photoelectric conversion layer 24 may include an organic material other than the organic semiconductor materials described above. As the organic material other than the organic semiconductor materials described above, for example, one kind of quinacridone, boron subphthalocyanine chloride, pentacene, benzothienobenzothiophene, naphthalene, anthracene, phenanthrene, tetracene, pyrene, perylene, fluoranthene, and derivatives thereof is preferably used. Alternatively, a polymer such as phenylenevinylene, fluorene, carbazole, indole, pyrene, pyrrole, picoline, thiophene, acetylene, diacetylene or a derivative thereof may be used. Additionally, it is possible to preferably use a metal complex dye, a cyanine-based dye, a merocyanine-based dye, a phenylxanthene-based dye, a triphenylmethane-based dye, a rhodacyanine-based dye, a xanthene-based dye, a macrocyclic azaannulene-based dye, an azulene-based dye, naphthaquinone, an anthraquinone-based dye, a chain compound in which a condensed polycyclic aromatic group such as anthracene and pyrene and an aromatic ring or a heterocyclic compound are condensed, a cyanine-like dye bonded by two nitrogen-containing hetero rings such as quinoline, benzothiazole, and benzoxazole that have a squarylium group and a croconic methine group as a bonded chain, or by a squarylium group or a croconic methine group, or the like. It is to be noted that as the metal complex dye described above, a dithiol metal complex-based dye, a metallophthalocyanine dye, a metalloporphyrine dye, or a ruthenium complex dye is preferable, but the metal complex dye is not limited thereto.

The upper electrode 25 includes an electrically conductive film having light transmissivity similarly to the lower electrode 21. In the imaging device 1 using the imaging element 10A as one pixel, the upper electrode 25 may be provided separately for each of the pixels, or may be formed as a common electrode for the respective pixels. The upper electrode 25 has a thickness of 10 nm to 200 nm, for example.

Any other layer may be provided each between the semiconductor layer 23 and the photoelectric conversion layer 24 and between the photoelectric conversion layer 24 and the upper electrode 25. For example, as with an imaging element 10B illustrated in FIG. 5, for example, the semiconductor layer 23, an electron blocking layer 24A (a first electric charge blocking layer), the photoelectric conversion layer 24, and a hole blocking layer 24B (a second electric charge blocking layer) may be stacked in order from the lower electrode 21 side. Furthermore, a undercoat layer and a hole transport layer may be provided between the lower electrode 21 and the photoelectric conversion layer 24, or a work function adjustment layer, a buffer layer, or an electron transport layer may be provided between the photoelectric conversion layer 24 and the upper electrode 25.

The insulating layer 22 electrically separates the accumulation electrode 21B and the semiconductor layer 23 from each other. The insulating layer 22 is provided, for example, on the interlayer insulating layer 28 to cover the lower electrode 21. In addition, the insulating layer 22 has the opening 22H above the readout electrode 21A of the lower electrode 21, and the readout electrode 21A and the semiconductor layer 23 are electrically coupled to each other via the opening 22H. The insulating layer 22 includes, for example, a single-layer film including one kind of silicon oxide ($SiO_x$), silicon nitride ($SiN_x$), silicon oxynitride (SiON), and the like, or a stacked film including two or more kinds thereof. The insulating layer 22 has a thickness of 20 nm to 500 nm, for example.

The dielectric film 26 prevents reflection of light generated by a difference in refractive index between the semiconductor substrate 30 and the insulating film 27. As a material of the dielectric film 26, a material having a refractive index that falls between the refractive index of the semiconductor substrate 30 and the refractive index of the insulating film 27 is preferable. Further, as the material of the dielectric film 26, for example, a material that is able to form a film having negative fixed electric charges is preferably used. Alternatively, as the material of the dielectric film 26, a semiconductor material or an electrically conductive material having a wider band gap than that of the semiconductor substrate 30 is preferably used. This makes it possible to suppress generation of a dark current at an interface of the semiconductor substrate 30. Such materials include hafnium oxide ($HfO_x$), aluminum oxide ($AlO_x$), zirconium oxide ($ZrO_x$), tantalum oxide ($TaO_x$), titanium oxide ($TiO_x$), lanthanum oxide ($LaO_x$), praseodymium oxide ($PrO_x$), cerium oxide ($CeO_x$), neodymium oxide ($NdO_x$), promethium oxide ($PmO_x$), samarium oxide ($SmO_x$), europium oxide ($EuO_x$), gadolinium oxide ($GdO_x$), terbium oxide ($TbO_x$), dysprosium oxide ($DyO_x$), holmium oxide ($HoO_x$), thulium oxide ($TmO_x$), ytterbium oxide ($YbO_x$), lutetium oxide ($LuO_x$), yttrium oxide ($YO_x$), hafnium nitride ($HfN_x$), aluminum nitride ($AlN_x$), hafnium oxynitride ($HfO_xN_y$), aluminum oxynitride ($AlO_xN_y$), and the like.

The insulating film 27 is provided on the dielectric film 26 that is formed on the first surface (the surface 30S1) of the semiconductor substrate 30 and a side surface of the through hole 30H, and electrically insulates the through electrode 34 and the semiconductor substrate 30 from each other. Examples of a material of the insulating film 27 include silicon oxide ($SiO_x$), TEOS, silicon nitride ($SiN_x$), silicon oxynitride (SiON), and the like.

The interlayer insulation layer 28 includes, for example, a single-layer film including one kind of silicon oxide ($SiO_x$), TEOS, silicon nitride ($SiN_x$), silicon oxynitride (SiON), and the like, or a stacked film including two or more kinds thereof.

The protective layer 51 includes a material having light transmissivity, and includes, for example, a single-layer film including one of silicon oxide ($SiO_x$), silicon nitride ($SiN_x$), silicon oxynitride (SiON), and the like, or a stacked film including two or more kinds thereof. The protective layer 51 has a thickness of 100 nm to 30000 nm, for example.

The semiconductor substrate 30 includes an n-type silicon (Si) substrate, for example, and has a p-well 31 in a predetermined region (for example, a pixel section 1a). The transfer transistors Tr2 and Tr3, the amplifier transistor AMP, the reset transistor RST, the selection transistor SEL, and the like described above are provided on the second surface (the surface 30S2) of the p-well 31. In addition, as illustrated in FIG. 2, for example, a pixel readout circuit 110 and a pixel drive circuit 120 that include a logic circuit and the like are provided in a peripheral section (a peripheral section 1b) of the semiconductor substrate 30.

The reset transistor RST (the reset transistor Tr1rst) resets electric charges transferred from the organic photoelectric converter 20 to the floating diffusion FD1, and includes, for example, a MOS transistor. Specifically, the reset transistor Tr1rst includes the reset gate Grst, a channel formation region 36A, and source/drain regions 36B and 36C. The reset gate Grst is coupled to a reset line RST1, and the one source/drain region 36B of the reset transistor Tr1rst also serves as the floating diffusion FD1. The other source/drain region 36C included in the reset transistor Tr1rst is coupled to a power source VDD.

The amplifier transistor AMP is a modulation element that modulates an amount of electric charges generated in the organic photoelectric converter 20 into voltage, and includes, for example, a MOS transistor. Specifically, the amplifier transistor AMP includes a gate Gamp, a channel formation region 35A, and source/drain regions 35B and 35C. The gate Gamp is coupled to the readout electrode 21A and the one source/drain region 36B (the floating diffusion FD1) of the reset transistor Tr1rst via the first lower contact 45, the coupling section 41A, the second lower contact 46, the through electrode 34, and the like. In addition, one source/drain region 35B shares a region with the other source drain region 36C included in the reset transistor Tr1rst, and is coupled to the power source VDD.

The selection transistor SEL (a selection transistor TR1sel) includes a gate Gsel, a channel formation region 34A, and source/drain regions 34B and 34C. The gate Gsel is coupled to a selection line SEL1. In addition, one source/drain region 34B shares a region with the other source/drain region 35C included in the amplifier transistor AMP, and the other source/drain region 34C is coupled to a signal line (a data output line) VSL1.

The inorganic photoelectric converters 32G and 32R each have a pn junction in a predetermined region of the semiconductor substrate 30. The inorganic photoelectric converters 32G and 32R enable dispersion of light in the longitudinal direction with use of a difference in wavelength of absorbed light depending on a depth of light incidence in the silicon substrate. The inorganic photoelectric converter 32G selectively detects green light to accumulate signal electric charges corresponding to green, and is disposed at a depth that allows for efficient photoelectric conversion of the green light. The inorganic photoelectric converter 32R selectively detects red light to accumulate signal electric charges corresponding to red, and is disposed at a depth that allows for efficient photoelectric conversion of the red light. It is to be noted that green (G) and red (R) are colors respectively corresponding to a wavelength band from 495 nm to 620 nm, for example, and a wavelength band from 620 nm to 750 nm, for example. It is sufficient if each of the inorganic photoelectric converters 32G and 32R is allowed to detect light in a portion or the entirety of a corresponding one of the wavelength bands.

The inorganic photoelectric converter 32G includes, for example, a p+ region serving as a hole accumulation layer, and an n region serving as an electron accumulation layer. The inorganic photoelectric converter 32R includes, for example, a p+ region serving as a hole accumulation layer, and an n region serving as an electron accumulation layer (has a p-n-p stacking structure). The n region of the inorganic photoelectric converter 32G is coupled to the vertical transfer transistor Tr2. The p+ region of the inorganic photoelectric converter 32G bends along the transfer transistor Tr2 and is coupled to the p+ region of the inorganic photoelectric converter 32R.

The transfer transistor Tr2 (a transfer transistor TR2*trs*) transfers, to the floating diffusion FD2, signal electric charges corresponding to green generated and accumulated in the inorganic photoelectric converter 32G. The inorganic photoelectric converter 32G is formed at a position deep from the second surface (the surface 30S2) of the semiconductor substrate 30; therefore, the transfer transistor TR2*trs* of the inorganic photoelectric converter 32G preferably includes a vertical transistor. In addition, the transfer transistor TR2*trs* is coupled to a transfer gate line TG2. Further, the floating diffusion FD2 is provided in a region 37C in proximity to the gate Gtrs2 of the transfer transistor TR2*trs*. Electric charges accumulated in the inorganic photoelectric converter 32G are read by the floating diffusion FD2 via a transfer channel formed along the gate Gtrs2.

The transfer transistor Tr3 (a transfer transistor TR3*trs*) transfers, to the floating diffusion FD3, signal electric charges corresponding to red generated and accumulated in the inorganic photoelectric converter 32R, and includes, for example, a MOS transistor. In addition, the transfer transistor TR3*trs* is coupled to a transfer gate line TG3. Further, the floating diffusion FD3 is provided in a region 38C in proximity to the gate Gtrs3 of the transfer transistor TR3*trs*. Electric charges accumulated in the inorganic photoelectric converter 32R are read by the floating diffusion FD3 via a transfer channel formed along the gate Gtrs3.

A reset transistor TR2*rst*, an amplifier transistor TR2*amp*, and a selection transistor TR2sel that are included in a controller of the inorganic photoelectric converter 32G are further provided on the second surface (the surface 30S2) side of the semiconductor substrate 30. In addition, a reset transistor TR3*rst*, an amplifier transistor TR3*amp*, and a selection transistor TR3*sel* that are included in a controller of the inorganic photoelectric converter 32R are provided.

The reset transistor TR2*rst* includes a gate, a channel formation region, and source/drain regions. The gate of the reset transistor TR2*rst* is coupled to a reset line RST2, and one source drain region of the reset transistor TR2*rst* is coupled to the power source VDD. Another source/drain region of the reset transistor TR2*rst* also serves as the floating diffusion FD2.

The amplifier transistor TR2*amp* includes a gate, a channel formation region, and source/drain regions. The gate is coupled to the other source/drain region (the floating diffusion FD2) of the reset transistor TR2*rst*. In addition, one source/drain region included in the amplifier transistor TR2*amp* shares a region with the one source/drain region included in the reset transistor TR2*rst*, and is coupled to the power source VDD.

The selection transistor TR2sel includes a gate, a channel formation region, and source/drain regions The gate is coupled to a selection line SEL2. In addition, one source/drain region included in the selection transistor TR2sel shares a region with another source/drain region included in the amplifier transistor TR2*amp*. Another source/drain region included in the selection transistor TR2sel is coupled t a signal line (a data output line) VSL2.

The reset transistor TR3*rst* includes a gate, a channel formation region, and source/drain regions. The gate of the reset transistor TR3*rst* is coupled to a reset line RST3, and one source/drain region included in the reset transistor TR3*rst* is coupled to the power source VDD. Another source/drain region included in the reset transistor TR3*rst* also serves as the floating diffusion FD3.

The amplifier transistor TR3*amp* includes a gate, a channel formation region, and source/drain regions. The gate is coupled to the other source/drain region (the floating diffusion FD3) included in the reset transistor TR3*rst*. In addition, one source/drain region included in the amplifier transistor TR3*amp* shares a region with the one source/drain region included in the reset transistor TR3*rst*, and is coupled to the power source VDD.

The selection transistor TR3*sel* includes a gate, a channel formation region, and source/drain regions. The gate is coupled to a selection line SEL3. One source/drain region included in the selection transistor TR3*sel* shares a region with another source/drain region included in the amplifier transistor TR3*amp*. Another source/drain region included in the selection transistor TR3*sel* is coupled to a signal line (a data output line) VSL3.

The reset lines RST1, RST2, and RST3, the selection lines SEL1, SEL2, and SEL3, and the transfer gate lines TG2 and TG3 are each coupled to a vertical drive circuit 112 included in a drive circuit. The signal lines (data output lines) VSL1, VSL2, and VSL3 are coupled to a column signal processing circuit 113 included in the drive circuit.

The first lower contact 45, the second lower contact 46, the first upper contact 29A, the second upper contact 29B, and a third upper contact 29C each include, for example, a doped silicon material such as PDAS (Phosphorus Doped Amorphous Silicon) or a metal material such as aluminum (Al), tungsten (W), titanium (Ti), cobalt (Co), hafnium (Hf), and tantalum (Ta).

(1-2. Method of Manufacturing Imaging Element)

It is possible to manufacture the imaging element 10A according to the present embodiment as follows, for example.

FIGS. 6 to 10 illustrate a method of manufacturing the imaging element 10A in process order. First, as illustrated in FIG. 6, for example, the p-well 31 is formed as a well of a first conductivity type in the semiconductor substrate 30, and the inorganic photoelectric converters 32G and 32R of a second conductivity type (for example, an n type) are formed in this p-well 31. A p+ region is formed in proximity to the first surface (the surface 30S1) of the semiconductor substrate 30.

Similarly, as illustrated in FIG. 6, on the second surface (the surface 30S2) of the semiconductor substrate 30, for example, n+ regions serving as the floating diffusions FD1 to FD3 are formed, and thereafter, a gate insulating layer 33 and a gate wiring layer 47 including respective gates of the transfer transistor Tr2, the transfer transistor Tr3, the selection transistor SEL, the amplifier transistor AMP, and the reset transistor RST are formed. Thus, the transfer transistor Tr2, the transfer transistor Tr3, the selection transistor SEL, the amplifier transistor AMP, and the reset transistor RST are formed. Further, the multilayer wiring 40 including the wiring layers 41 to 43 and the insulating layer 44 is formed on the second surface (the surface 30S2) of the semiconductor substrate 30. The wiring layers 41 to 43 include the first lower contact 45, the second lower contact 46, and the coupling section 41A.

As a base substrate of the semiconductor substrate 30, an SOI (Silicon on Insulator) substrate is used in which the semiconductor substrate 30, an embedded oxide film (not illustrated), and a retaining substrate (not illustrated) are stacked. The embedded oxide film and the retaining substrate are not illustrated in FIG. 6, but are joined to the first surface (the surface 30S1) of the semiconductor substrate 30. Annealing treatment is performed after ion implantation.

Next, a supporting substrate (not illustrated), another semiconductor substrate, or the like is joined to the second surface (the surface 30S2) side (the multilayer wiring 40 side) of the semiconductor substrate 30 and flipped from top to bottom. Subsequently, the semiconductor substrate 30 is separated from the embedded oxide film and the retaining substrate of the SOI substrate to expose the first surface (the surface 30S1) of the semiconductor substrate 30. It is possible to perform the above processes with technologies used in a normal CMOS process such as ion implantation and CVD (Chemical Vapor Deposition).

Next, as illustrated in FIG. 7, the semiconductor substrate 30 is processed from the first surface (the surface 30S1) side, for example, by dry etching to form, for example, an annular through hole 30H. As illustrated in FIG. 7, a depth of the through hole 30H preferably penetrates from the first surface (the surface 30S1) to the second surface (the surface 30S2) of the semiconductor substrate 30 and reaches the coupling section 41A, for example.

Subsequently, as illustrated in FIG. 8, the dielectric film 26 is formed on the first surface (the surface 30S1) of the semiconductor substrate 30 and the side surface of the through hole 30H with use of an atomic layer deposition (Atomic Layer Deposition; ALD) method, for example. Thus, the dielectric film 26 is continuously formed on the first surface (the surface 30S1) of the semiconductor substrate 30 and the side surface and a bottom surface of the through hole 30H. Next, the insulating film 27 is formed on the first surface (the surface 30S1) of the semiconductor substrate 30 and in the through hole 30H, and thereafter the insulating film 27 and the dielectric film 26 formed on the bottom surface of the through hole 30H are removed by dry etching, for example, to expose the coupling section 41A. It is to be noted that at this time, the insulating film 27 on the first surface (the surface 30S1) is also thinned. Subsequently, an electrically conductive film is formed on the insulating film 27 and in the through hole 30H, and thereafter a photoresist PR is formed at a predetermined position on the electrically conductive film. Next, etching and removal of the photoresist PR are performed to form the through electrode 34 having an overhang portion on the first surface (the surface 30S1) of the semiconductor substrate 30.

Next, as illustrated in FIG. 9, an insulating film that forms the interlayer insulating layer 28 is formed on the insulating film 27 and the through electrode 34, and thereafter, the first upper contact 29A, pad sections 39A and 39B, the second upper contact 29B, and the third upper contact 29C are formed on the through electrode 34, and the like. Thereafter, a surface of the interlayer insulating layer 28 is planarized with use of a CMP (Chemical Mechanical Polishing) method. Next, an electrically conductive film 21x is formed on the interlayer insulating layer 28, and thereafter a photoresist is formed at a predetermined position of the electrically conductive film 21x.

Subsequently, as illustrated in FIG. 10, etching and removal of the photoresist are performed to form the readout electrode 21A and the accumulation electrode 21B.

Thereafter, the insulating layer 22 is formed on the interlayer insulating layer 28, the readout electrode 21A, and the accumulation electrode 21B, and thereafter, the opening 22H is provided on the readout electrode 21A. Next, the semiconductor layer 23, the photoelectric conversion layer 24, and the upper electrode 25 are formed in order on the insulating layer 22. Finally, the protective layer 51, the light-shielding film 52, and the on-chip lens 53 are provided on the upper electrode 25. Thus, the imaging element 10A illustrated in FIG. 1 is completed.

It is to be noted that in a case where the semiconductor layer 23 and other organic layers are formed with use of an organic material, it is desirable to form the semiconductor layer 23 and the organic layers continuously (by an in-situ vacuum process) in a vacuum process. In addition, a method of forming the organic photoelectric conversion layer 16 is not necessarily limited to a method using a vacuum evaporation method, and, other methods, for example, spin coating technology, printing technology, and the like may be used. Further, methods of forming transparent electrodes (the lower electrode 21 and the upper electrode 25) may include, depending on materials included in transparent electrodes, a physical vapor deposition method (PVD method) such as a vacuum evaporation method, a reactive evaporation method, various kinds of sputtering methods, an electron beam evaporation method, and an ion plating method, a pyrosol method, a method of pyrolyzing an organic metal component, a spraying method, a dip method, various kinds of chemical vapor deposition methods (CVD methods) including a MOCVD method, an electroless plating method, and an electroplating method.

In the imaging element 10A, in a case where light enters the organic photoelectric converter 20 via the on-chip lenses 53, the light passes through the organic photoelectric converter 20 and the inorganic photoelectric converters 32G and 32R in order, and each of green light, blue light, and red light is photoelectrically converted in the course of passing. Signal acquisition operations of the respective colors are described below.

(Acquisition of Blue Signal by Organic Photoelectric Converter 20)

Of light having entered the imaging element 10A, first, blue light is selectively detected (absorbed) and photoelectrically converted in the organic photoelectric converter 20.

The organic photoelectric converter 20 is coupled to the gate Gamp of the amplifier transistor AMP and the floating diffusion FD1 via the through electrode 34. Thus, electrons of electron-hole pairs generated in the organic photoelectric converter 20 are extracted from the lower electrode 21 side, transferred to the second surface (the surface 30S2) side of the semiconductor substrate 30 via the through electrode 34, and accumulated in the floating diffusion FD1. Simultaneously with this, the amount of electric charges generated in the organic photoelectric converter 20 is modulated into voltage by the amplifier transistor AMP.

In addition, the reset gate Grst of the reset transistor RST is disposed adjacent to the floating diffusion FD1. Accordingly, the electric charges accumulated in the floating diffusion FD1 are reset by the reset transistor RST.

Herein, the organic photoelectric converter 20 is coupled not only to the amplifier transistor AMP but also to the floating diffusion FD1 via the through electrode 34, thus making it possible for the reset transistor RST to easily reset the electric charges accumulated in the floating diffusion FD1.

In contrast to this, in a case where the through electrode 34 is not coupled to the floating diffusion FD1, it is difficult to reset the electric charges accumulated in the floating diffusion FD1, causing the electric charges to be drawn to the upper electrode 25 side by application of a large voltage. This may damage the photoelectric conversion layer 24. In addition, a configuration that enables resetting in a short period of time causes an increase in dark time noise, thereby resulting in a trade-off; therefore, this configuration is difficult.

FIG. 11 illustrates an operation example of the imaging element 10A, where (A) indicates a potential at the accumulation electrode 21B, (B) indicates a potential at the floating diffusion FD1 (the readout electrode 21A), and (C) indicates a potential at the gate (Gsel) of the reset transistor TR1$rst$. In the imaging element 10A, a voltage is individually applied to each of the readout electrode 21A and the accumulation electrode 21B.

In the imaging element 10A, in an accumulation period, a drive circuit applies a potential V1 to the readout electrode 21A, and applies a potential V2 to the accumulation electrode 21B. Here, it is assumed that the potentials V1 and V2 satisfy V2>V1. This causes electric charges (signal electric charges; electrons) generated by photoelectric conversion to be drawn to the accumulation electrode 21B and accumulated in a region of the semiconductor layer 23 opposed to the accumulation electrode 21B (the accumulation period). Additionally, the value of the potential in the region of the semiconductor layer 23 opposed to the accumulation electrode 21B becomes more negative with the passage of time of photoelectric conversion. It is to be noted that holes are sent from the upper electrode 25 to the drive circuit.

In the imaging element 10A, a reset operation is performed in a later period of the accumulation period. Specifically, at a timing t1, a scanner changes the voltage of a reset signal RST from a low level to a high level. This turns on the reset transistor TR1$rst$ in the unit pixel P, and as a result, the voltage of the floating diffusion FD1 is set to a power source voltage VDD, and the voltage of the floating diffusion FD1 is reset (a reset period).

After completion of the reset operation, electric charges are read out. Specifically, at a timing t2, the drive circuit applies a potential V3 to the readout electrode 21A, and applies a potential V4 to the accumulation electrode 21B. Here, it is assumed that the potentials V3 and V4 satisfy V3<V4. This causes electric charges accumulated in a region corresponding to the accumulation electrode 21B to be read out from the readout electrode 21A to the floating diffusion FD1. That is, electric charges accumulated in the semiconductor layer 23 are read out by a controller (a transfer period).

After completion of a readout operation, the drive circuit applies the potential V1 to the readout electrode 21A again, and applies the potential V2 to the accumulation electrode 21B again. This causes electric charges generated by photoelectric conversion to be drawn to the accumulation electrode 21B and accumulated in the region of the photoelectric conversion layer 24 opposed to the accumulation electrode 21B (the accumulation period).

(Acquisition of Green Signal and Red Signal by Inorganic Photoelectric Converters 32G and 32R)

Subsequently, green light and red light of the light having passed through the organic photoelectric converter 20 are absorbed and photoelectrically converted in sequence respectively in the inorganic photoelectric converter 32G and the inorganic photoelectric converter 32R. In the inorganic photoelectric converter 32G, electrons corresponding to the incident green light are accumulated in the n region of the inorganic photoelectric converter 32G, and the accumulated electrons are transferred to the floating diffusion FD2 by the transfer transistor Tr2. Similarly, in the inorganic photoelectric converter 32R, electrons corresponding to the incident red light are accumulated in the n region of the inorganic photoelectric converter 32R, and the accumulated electrons are transferred to the floating diffusion FD3 by the transfer transistor Tr3.

(1-3. Workings and Effects)

As described above, development of a photoelectric conversion element for blue light having high external quantum efficiency is desired. For example, a blue organic photoelectric conversion element using a porphyrin dye has been reported; however, external quantum efficiency thereof is about 20% at 80 V. In addition, a photoelectric conversion element using a combination of fullerene and a coumarin dye as materials of a blue organic photoelectric conversion film has been reported; however, external quantum efficiency thereof is about 23% at 5 V.

In contrast, in the present embodiment, as the material of the photoelectric conversion layer 24, the benzothienobenzothiophene-based compound represented by the general formula (1) described above is used.

In the benzothienobenzothiophene-based compound represented by the general formula (1) described above, a major axis of a molecule takes face-on orientation horizontal to a substrate surface. In addition, the benzothienobenzothiophene-based compound represented by the general formula (1) described above may become herringbone-type crystal that is advantageous in carrier transport by strong intermolecular interaction by a benzothienobenzothiophene skeleton. Accordingly, the benzothienobenzothiophene-based compound represented by the general formula (1) in the photoelectric conversion layer 24 exhibits high carrier mobility with respect to a vertical direction of each of electrode surfaces of the lower electrode 21 and the upper electrode 25. In addition, the benzothienobenzothiophene-based compound represented by the general formula (1) exhibits superior optical response current at a low voltage.

As described above, the photoelectric conversion layer 24 is formed that absorbs light of 400 nm to 500 nm both inclusive and has high carrier mobility to the lower electrode 21 and the upper electrode 25. This makes it possible to provide the imaging element 10A for blue light having high external quantum efficiency.

In addition, the benzothienobenzothiophene-based compound represented by the general formula (1) exhibits high carrier mobility with respect to the vertical direction of each of the electrode surfaces of the lower electrode 21 and the upper electrode 25 that are opposed to each other with the photoelectric conversion layer 24 interposed therebetween. This makes it possible to improve photocurrent on-off response characteristics depending on presence or absence of light irradiation.

Additionally, the benzothienobenzothiophene-based compound represented by the general formula (1) has a transition dipole moment horizontal to a light incident direction, which makes it possible to strongly absorb light of 400 nm to 500 nm both inclusive. Accordingly, an on-chip color filter is not necessary, and it is possible to configure a so-called longitudinal spectral type imaging element in which photoelectric converters absorbing light of wavelengths different from each other are stacked in the longitudinal direction, similarly to the imaging element 10A according to the present embodiment.

Next, description is given of second to fifth embodiments of the present disclosure. In the following, components similar to those in the first embodiment described above are denoted by the same reference numerals, and description thereof is omitted.

2. Second Embodiment

FIG. 12 illustrates a cross-sectional configuration of an imaging element (an imaging element 10C) according to the second embodiment of the present disclosure. The imaging element 10C is included, for example, in one pixel (a unit pixel P) in an imaging device (the imaging device 1) such as a CMOS image sensor used for an electronic apparatus such as a digital still camera and a video camera. The imaging element 10C according to the present embodiment includes two organic photoelectric converters 20 and 70 and one inorganic photoelectric converter 32 that are stacked in the longitudinal direction.

The organic photoelectric converters 20 and 70 and the inorganic photoelectric converter 32 each selectively detect light in a corresponding one of wavelength bands different from each other, and perform photoelectric conversion of the thus-detected light. Specifically, for example, the organic photoelectric converter 20 acquires a blue (B) color signal similarly to the first embodiment described above. The organic photoelectric converter 70 acquires, for example, a green (G) color signal. The inorganic photoelectric converter 32 acquires, for example, a red (R) color signal. This allows the imaging element 10C to acquire a plurality of kinds of color signals in one pixel without using a color filter.

The organic photoelectric converter 70 is stacked above the organic photoelectric converter 20, for example, and has a configuration in which a lower electrode 71, a semiconductor layer 73, a photoelectric conversion layer 74, and an upper electrode 75 are stacked in this order from the first surface (the surface 30S1) side of the semiconductor substrate 30, similarly to the organic photoelectric converter 20. In addition, an insulating layer 72 is provided between the lower electrode 71 and the semiconductor layer 73. The lower electrode 71 is formed separately for each imaging element 10C, for example, and includes a readout electrode 71A and an accumulation electrode 71B that are separated from each other with the insulating layer 72 interposed therebetween as described in detail later. The readout electrode 71A of the lower electrode 71 is electrically coupled to the photoelectric conversion layer 74 via an opening 72H provided in the insulating layer 72. FIG. 12 illustrates an example in which the semiconductor layer 73, the photoelectric conversion layer 74, and the upper electrode 75 are formed separately for each imaging element 10C; however, the semiconductor layer 73, the photoelectric conversion layer 74, and the upper electrode 75 may be formed as common continuous layers for a plurality of imaging elements 10C, for example.

The photoelectric conversion layer 74 converts optical energy into electric energy, and includes, for example, two or more kinds of organic materials (p-type semiconductor materials or n-type semiconductor materials) that each function as a p-type semiconductor or an n-type semiconductor, similarly to the photoelectric conversion layer 24. The photoelectric conversion layer 74 may include, in addition to the p-type semiconductor material and the n-type semiconductor material, an organic material, i.e., a so-called dye material, that photoelectrically converts light in a predetermined wavelength band and allows light in another wavelength band to pass therethrough. In a case where the photoelectric conversion layer 74 is formed by using three kinds of organic materials, that is, the p-type semiconductor material, the n-type semiconductor material, and the dye material, the p-type semiconductor material and the n-type semiconductor material are preferably materials having light transmissivity in a visible region (for example, from 400 nm to 700 nm). The thickness of the photoelectric conversion layer 74 is, for example, from 25 nm to 400 nm both inclusive, preferably from 50 nm to 350 nm both inclusive, and more preferably from 150 nm to 300 nm both inclusive. Examples of the dye material used for the photoelectric conversion layer 74 include subphthalocyanine, phthalocyanine, coumarin, porphyrin, a derivative thereof, a derivative thereof, or the like.

Two through electrodes 34X and 34Y are provided between the first surface (the surface 30S1) and the second surface (the surface 30S2) of the semiconductor substrate 30.

Similarly to the first embodiment described above, the through electrode 34X is electrically coupled to the readout electrode 21A of the organic photoelectric converter 20, and the organic photoelectric converter 20 is coupled to the gate Gamp of the amplifier transistor AMP and one source/drain region 36B1 of the reset transistor RST (the reset transistor Tr1rst) also serving as the floating diffusion FD1 via the through electrode 34X. An upper end of the through electrode 34X is coupled to the readout electrode 21A via the first upper contact 29A, the pad section 39A, and the second upper contact 29B, for example.

The through electrode 34Y is electrically coupled to the readout electrode 71A of the organic photoelectric converter 70, and the organic photoelectric converter 70 is coupled to the gate Gamp of the amplifier transistor AMP and one source/drain region 36B2 of the reset transistor RST (a reset transistor Tr2rst) also serving as the floating diffusion FD2 via the through electrode 34Y. An upper end of the through electrode 34Y is coupled to the readout electrode 71A via a fourth upper contact 79A, a pad section 69A, a fifth upper contact 79B, a pad section 69B, and a sixth upper contact 79C, for example. In addition, a pad 69C is coupled to the accumulation electrode 71B of the lower electrode 71 included in the organic photoelectric converter 70 via a seventh upper contact 79D.

As described above, the imaging element 10B according to the present embodiment has a configuration in which two organic photoelectric converters 20 and 70 and one inorganic photoelectric converter 32 are stacked, and similarly to the first embodiment described above, for example, the photoelectric conversion layer 24 included in the organic photoelectric converter 20 that acquires the blue (B) color signal is formed by using the benzothienobenzothiophene-based compound represented by the general formula (1) described above. This makes it possible to achieve effects similar to those in the first embodiment described above.

3. Third Embodiment

FIG. 13 schematically illustrates a cross-sectional configuration of an imaging element (an imaging element 10D)

according to the third embodiment of the present disclosure. The imaging element 10D is included, for example, in one pixel (a unit pixel P) of an imaging device (the imaging device 1) such as a CMOS image sensor used for an electronic apparatus such as a digital still camera and a video camera. An organic photoelectric converter 80 according to the present embodiment differs from the first and second embodiments described above in that the organic photoelectric converter 80 has a configuration in which a lower electrode 81, the photoelectric conversion layer 24, and the upper electrode 25 are stacked in this order and the lower electrode 81 is formed as a solid film in a pixel.

The imaging element 10D includes, for each unit pixel P, one organic photoelectric converter 80 and two inorganic photoelectric converters 32G and 32R that are stacked in the longitudinal direction. The organic photoelectric converter 80 and the inorganic photoelectric converters 32G and 32R each selectively detect light in a corresponding one of wavelength bands different from each other, and perform photoelectric conversion of the thus-detected light. Specifically, for example, the organic photoelectric converter 80 acquires a blue (B) color signal similarly to the first embodiment described above. A multilayer wiring layer 40 is provided on the second surface (the surface 30S2) of the semiconductor substrate 30. The multilayer wiring layer 40 has, for example, a configuration in which the wiring layers 41, 42, and 43 are stacked in the insulating layer 44.

The organic photoelectric converter 80 is an organic photoelectric conversion element that absorbs light corresponding to a wavelength band of a portion or the entirety of a selective wavelength band (for example, from 400 nm to 700 nm both inclusive) to generate electron-hole pairs. The organic photoelectric converter 80 includes, for example, the lower electrode 81 and the upper electrode 25 that are opposed to each other, and the photoelectric conversion layer 24 that is provided between the lower electrode 81 and the upper electrode 25, as described above. As illustrated in FIG. 13, in the organic photoelectric converter 80 according to the present embodiment, the lower electrode 81, the photoelectric conversion layer 24, and the upper electrode 25 each have a configuration similar to that in the organic photoelectric converter 20 according to the first embodiment described above, except that the lower electrode 81 is formed as a solid film in each pixel.

For example, the floating diffusions (floating diffusion layers) FD1, FD2, and FD3, the vertical transistor (transfer transistor) Tr1, the transfer transistor Tr2, the amplifier transistor (modulation element) AMP, and the reset transistor RST are provided on the second surface (the surface 30S2) of the semiconductor substrate 30.

The vertical transistor Tr1 is a transfer transistor that transfers, to the floating diffusion FD1, signal electric charges corresponding to green generated and accumulated in the inorganic photoelectric converter 32G. The inorganic photoelectric converter 32G is formed at a position deep from the second surface (the surface 30S2) of the semiconductor substrate 30; therefore, the transfer transistor of the inorganic photoelectric converter 32G preferably includes the vertical transistor Tr1. The transfer transistor Tr2 transfers, to the floating diffusion FD2, signal electric charges corresponding to red generated and accumulated in the inorganic photoelectric converter 32R, and includes, for example, a MOS transistor. The amplifier transistor AMP is a modulation element that modulates an amount of electric charges generated in the organic photoelectric converter 80 into voltage, and includes, for example, a MOS transistor. The reset transistor RST resets electric charges transferred from the organic photoelectric converter 80 to the floating diffusion FD3, and includes, for example, a MOS transistor.

The first lower contact 45 and the second lower contact 46 each include, for example, a doped silicon material such as PDAS (Phosphorus Doped Amorphous Silicon) or a metal material such as aluminum (Al), tungsten (W), titanium (Ti), cobalt (Co), hafnium (Hf), and tantalum (Ta).

In the imaging element 10D, each color signal is acquired as follows.

(Acquisition of Blue Signal by Organic Photoelectric Converter 80)

Of light having entered the imaging element 10D, first, blue light is selectively detected (absorbed) and photoelectrically converted in the organic photoelectric converter 80. The organic photoelectric converter 80 is coupled to the gate Gamp of the amplifier transistor AMP and the floating diffusion FD3 via the through electrode 34. Thus, electrons of electron-hole pairs generated in the organic photoelectric converter 80 are extracted from the lower electrode 81 side, transferred to the second surface (the surface 30S2) side of the semiconductor substrate 30 via the through electrode 34, and accumulated in the floating diffusion FD3. Simultaneously with this, the amount of electric charges generated in the organic photoelectric converter 80 is modulated into voltage by the amplifier transistor AMP.

In addition, the reset gate Grst of the reset transistor RST is disposed adjacent to the floating diffusion FD3. Accordingly, the electric charges accumulated in the floating diffusion FD3 are reset by the reset transistor RST.

Herein, the organic photoelectric converter 80 is coupled not only to the amplifier transistor AMP but also to the floating diffusion FD3 via the through electrode 34, thus making it possible for the reset transistor RST to easily reset the electric charges accumulated in the floating diffusion FD3.

In contrast to this, in a case where the through electrode 34 is not coupled to the floating diffusion FD3, it is difficult to reset the electric charges accumulated in the floating diffusion FD3, causing the electric charges to be drawn to the upper electrode 25 side by application of a large voltage. This may damage the photoelectric conversion layer 24. In addition, a configuration that enables resetting in a short period of time causes an increase in dark time noise, thereby resulting in a trade-off; therefore, this configuration is difficult.

(Acquisition of Green Signal and Red Signal by Inorganic Photoelectric Converters 32G and 32R)

Subsequently, green light and red light of the light having passed through the organic photoelectric converter 80 are absorbed and photoelectrically converted in sequence respectively in the inorganic photoelectric converter 32G and the inorganic photoelectric converter 32R. In the inorganic photoelectric converter 32G, electrons corresponding to the incident green light are accumulated in the n region of the inorganic photoelectric converter 32G, and the accumulated electrons are transferred to the floating diffusion FD1 by the vertical transistor Tr1. Similarly, in the inorganic photoelectric converter 32R, electrons corresponding to the incident red light are accumulated in the n region of the inorganic photoelectric converter 32R, and the accumulated electrons are transferred to the floating diffusion FD2 by the transfer transistor Tr2.

As described above, in the imaging element 10D according to the present embodiment, the lower electrode 81 included in the organic photoelectric converter 80 is formed as a solid film, and similarly to the first embodiment described above, for example, the photoelectric conversion layer 24 included in the organic photoelectric converter 80 that acquires the blue (B) color signal is formed by using the benzothienobenzothiophene-based compound represented by the general formula (1) described above. This makes it possible to achieve effects similar to those in the first embodiment described above.

4. Fourth Embodiment

FIG. 14 schematically illustrates a cross-sectional configuration of an imaging element (an imaging element 10E) according to the fourth embodiment of the present disclosure. The imaging element 10E is included, for example, in one pixel (a unit pixel P) in an imaging device (the imaging device 1) such as a CMOS image sensor used for an electronic apparatus such as a digital still camera and a video camera. The imaging element 10E according to the present embodiment has a configuration in which a red photoelectric converter 90R, a green photoelectric converter 90G, and a blue photoelectric converter 90B are stacked in this order on the semiconductor substrate 30 with an insulating layer 96 interposed therebetween.

The red photoelectric converter 90R, the green photoelectric converter 90G, and the blue photoelectric converter 90B respectively include organic photoelectric conversion layers 92R, 92G, and 92B between a pair of electrodes, specifically between a first electrode 91R and a second electrode 93R, between a first electrode 91G and a second electrode 93G, and between a first electrode 91B and a second electrode 93B. The organic photoelectric conversion layer 92B is formed, for example, by using the benzothienobenzothiophene-based compound represented by the general formula (1) described above, similarly to the first embodiment described above.

An on-chip lens 98L is provided on the blue photoelectric converter 90B with a protective layer 97 and an on-chip lens layer 98 interposed therebetween. A red accumulation layer 310R, a green accumulation layer 310G, and a blue accumulation layer 310B are provided in the semiconductor substrate 30. Light having entered the on-chip lens 98L is photoelectrically converted by the red photoelectric converter 90R, the green photoelectric converter 90G, and the blue photoelectric converter 90B, and signal electric charges are transmitted from the red photoelectric converter 90R to the red accumulation layer 310R, from the green photoelectric converter 90G to the green accumulation layer 310G, and from the blue photoelectric converter 90B to the blue accumulation layer 310B. The signal electric charges may be electrons or holes generated by photoelectric conversion, but a case where electrons are read out as signal electric charges is described as an example below.

The semiconductor substrate 30 includes, for example, a p-type silicon substrate. The red accumulation layer 310R, the green accumulation layer 310G, and the blue accumulation layer 310B provided in the semiconductor substrate 30 each include an n-type semiconductor region, and signal electric charges (electrons) supplied from the red photoelectric converter 90R, the green photoelectric converter 90G, and the blue photoelectric converter 90B are accumulated in the n-type semiconductor regions. The n-type semiconductor regions of the red accumulation layer 310R, the green accumulation layer 310G, and the blue accumulation layer 310B are formed by doping the semiconductor substrate 30 with an n-type impurity such as phosphorus (P) or arsenic (As), for example. It is to be noted that the semiconductor substrate 30 may be provided on a supporting substrate (not illustrated) including glass or the like.

In the semiconductor substrate 30, a pixel transistor is provided. The pixel transfer is used to read electrons from each of the red accumulation layer 310R, the green accumulation layer 310G, and the blue accumulation layer 310B and transfer the electrons to a vertical signal line (for example, a vertical signal line Lsig in FIG. 15 to be described later), for example. A floating diffusion of the pixel transistor is provided in the semiconductor substrate 30, and the floating diffusion is coupled to the red accumulation layer 310R, the green accumulation layer 310G, and the blue accumulation layer 310B. The floating diffusion includes an n-type semiconductor region.

The insulating layer 96 includes, for example, a single-layer film including one kind of silicon oxide ($SiO_x$), silicon nitride ($SiN_x$), silicon oxynitride (SiON), hafnium oxide ($HfO_x$), and the like, or a stacked film including two or more kinds thereof. In addition, the insulating layer 96 may be formed by using an organic insulating material. Although not illustrated, the insulating layer 96 includes respective plugs for coupling between the red accumulation layer 310R and the red photoelectric converter 90R, between the green accumulation layer 310G and the green photoelectric converter 90G, and between the blue accumulation layer 310B and the blue photoelectric converter 90B, and electrodes.

The red photoelectric converter 90R includes the first electrode 91R, the organic photoelectric conversion layer 92R, and the second electrode 93R in this order from a position close to the semiconductor substrate 30. The green photoelectric converter 90G includes the first electrode 91G, the organic photoelectric conversion layer 92G, and the second electrode 93G in this order from a position close to the red photoelectric converter 90R. The blue photoelectric converter 90B includes the first electrode 91B, the organic photoelectric conversion layer 92B, and the second electrode 93B in this order from a position close to the green photoelectric converter 90G. An insulating layer 94 is provided between the red photoelectric converter 90R and the green photoelectric converter 90G, and an insulating layer 95 is provided between the green photoelectric converter 90G and the blue photoelectric converter 90B. The red photoelectric converter 90R, the green photoelectric converter 90G, and the blue photoelectric converter 90B respectively selectively absorb red (for example, a wavelength of 600 nm or greater and less than 700 nm) light, green (for example, a wavelength of 500 nm or greater and less than 600 nm) light, and blue (for example, a wavelength of 400 or greater and less than 500 nm) light to generate electron-hole pairs.

The first electrode 91R, the first electrode 91G, and the first electrode 91B respectively extract signal electric charges generated in the organic photoelectric conversion layer 92R, signal electric charges generated in the organic photoelectric conversion layer 92G, and signal electric charges generated in the organic photoelectric conversion layer 92B. The first electrodes 91R, 91G, and 91B are provided for each pixel, for example. The first electrodes 91R, 91G, and 91B include, for example, an electrically conductive material having light transmissivity, specifically ITO. The first electrodes 91R, 91G, and 91B may include, for example, a tin oxide-based material or a zinc oxide-based material. The tin oxide-based material is tin oxide to which a dopant is added, and examples of the zinc oxide-based material include aluminum zinc oxide prepared by adding aluminum as a dopant to zinc oxide, gallium zinc oxide prepared by adding gallium as a dopant to zinc oxide, indium zinc oxide prepared by adding indium as a dopant to zinc oxide, and the like. Other than these materials, it is possible to use IGZO, CuI, InSbO$_4$, ZnMgO, CuInO$_2$, MgIn$_2$O$_4$, CdO, ZnSnO$_3$, and the like. Each of the first electrodes 91R, 91G, and 91B has, for example, a thickness of 50 nm to 500 nm.

For example, an electron transport layer may be provided each between the first electrode 91R and the organic photoelectric conversion layer 92R, between the first electrode 91G and the organic photoelectric conversion layer 92G, and between the first electrode 91B and the organic photoelectric conversion layer 92B. The electron transport layer promotes supplying of electrons generated in the organic photoelectric conversion layers 92R, 92G, and 92B to the first electrodes 91R, 91G, and 91B, and includes, for example, titanium oxide, zinc oxide, or the like. The electron transport layer may be configured by stacking a titanium oxide film and a zinc oxide film. A thickness of the electron transport layer is, for example, from 0.1 nm to 1000 nm, and preferably from 0.5 nm to 300 nm.

The organic photoelectric conversion layer 92R, 92G, and 92B each absorb light in a selective wavelength band for photoelectric conversion, and allow light in another wavelength band to pass therethrough. Herein, the light in the selective wavelength band is, for example, light in a wavelength band of a wavelength of 600 nm or greater and less than 700 nm for the organic photoelectric conversion layer 92R, light in a wavelength band of a wavelength of 500 nm or greater and less than 600 nm for the organic photoelectric conversion layer 92G, and light in a wavelength band of a wavelength of 400 nm or greater and less than 500 nm for the organic photoelectric conversion layer 92B. A thickness of each of the organic photoelectric conversion layers 92R, 92G, and 92B is, for example, from 25 nm to 400 nm both inclusive, preferably from 50 nm to 350 nm both inclusive, and more preferably from 150 nm to 300 nm both inclusive.

The organic photoelectric conversion layers 92R, 92G, and 92B each convert optical energy into electric energy, and each include two or more kinds of organic materials (p-type semiconductor materials or n-type semiconductor materials) that each function as a p-type semiconductor or an n-type semiconductor similarly to the photoelectric conversion layer 24. The organic photoelectric conversion layers 92R, 92G, and 92B may include, in addition to the p-type semiconductor material and the n-type semiconductor material, an organic material, i.e., a so-called dye material, that photoelectrically converts light in the predetermined wavelength band described above and allows light in another wavelength band to pass therethrough. Examples of such a material include rhodamine, merocyanine, and derivatives thereof for the organic photoelectric conversion layer 92R. The examples include subphthalocyanine, phthalocyanine, coumarin, porphyrin, and derivatives thereof for the organic photoelectric conversion layer 92G. The examples include the benzothienobenzothiophene-based compound represented by the general formula (1) described above for the organic photoelectric conversion layer 92B.

Examples of the organic materials included in the organic photoelectric conversion layers 92R, 92G, and 92B include fullerene or a fullerene derivative. The organic photoelectric conversion layers 92R, 92G, and 92B may further include an organic material other than the organic materials described above.

For example, a hole transport layer may be provided each between the organic photoelectric conversion layer 92R and the second electrode 93R, between the organic photoelectric conversion layer 92G and the second electrode 93G, and between the organic photoelectric conversion layer 92B and the second electrode 93B. The hole transport layer promotes supplying of holes generated in the organic photoelectric conversion layers 92R, 92G, and 92B to the second electrodes 93R, 93G, and 93B, and includes, for example, molybdenum oxide, nickel oxide, vanadium oxide, or the like. The hole transport layer may include an organic material such as PEDOT (Poly(3,4-ethylenedioxythiophene)) and TPD (N,N'-Bis(3-methylphenyl)-N,N'-diphenylbenzidine). The hole transport layer has, for example, a thickness of 0.5 nm to 100 nm both inclusive.

The second electrode 93R, the second electrode 93G, and the second electrode 93B respectively extract holes generated in the organic photoelectric conversion layer 92R, holes generated in the organic photoelectric conversion layer 92G, and holes generated in the organic photoelectric conversion layer 92B. The holes extracted from each of the second electrodes 93R, 93G, and 93B are discharged to, for example, a p-type semiconductor region (not illustrated) in the semiconductor substrate 30 via each transmission path (not illustrated). The second electrodes 93R, 93G, and 93B include, for example, an electrically conductive material such as gold (Au), silver (Ag), copper (Cu), and aluminum (Al). Similarly to first electrodes 91R, 91G, and 91B, the second electrodes 93R, 93G, and 93B may include a transparent electrically conductive material. In the imaging element 10E, the holes extracted from the second electrodes 93R, 93G, and 93B are discharged; therefore, for example, in a case where a plurality of imaging elements 10E is disposed in the imaging device 1 to be described later, the second electrodes 93R, 93G, and 93B may be provided common to each of the imaging elements 10E (unit pixels P). Each of the second electrodes 93R, 93G, and 93B has, for example, a thickness of 0.5 nm to 100 nm both inclusive.

The insulating layer 94 insulates the second electrode 93R and the first electrode 91G from each other. The insulating layer 95 insulates the second electrode 93G and the first electrode 91B from each other. The insulating layers 94 and 95 include, for example, a metal oxide, a metal sulfide, or an organic substance. Examples of the metal oxide include silicon oxide (SiO$_x$), aluminum oxide (AlO$_x$), zirconium oxide (ZrO$_x$), titanium oxide (TiO$_x$), zinc oxide (ZnO$_x$), tungsten oxide (WO$_x$), magnesium oxide (MgO$_x$), niobium oxide (NbO$_x$), tin oxide (SnO$_x$), gallium oxide (GaO$_x$), and the like. Examples of the metal sulfide include zinc sulfide (ZnS), magnesium sulfide (MgS), and the like. A band gap of a constituent material of each of the insulating layers 94 and 95 is preferably 3.0 eV or greater. Each of the insulating layers 94 and 95 has, for example, a thickness of 2 nm to 100 nm both inclusive.

As described above, the organic photoelectric conversion layer 92B is formed by using the benzothienobenzothiophene-based compound represented by the general formula (1) described above, which makes it possible to achieve effects similar to those in the first embodiment described above.

5. APPLICATION EXAMPLES

Application Example 1

FIG. 15 illustrates an overall configuration of an imaging device (the imaging device 1) using, for each of the pixels, the imaging element 10A (or any of the imaging elements 10B to 10E) described in the first to fourth embodiments described above. The imaging device 1 is a CMOS image sensor, and includes, on the semiconductor substrate 30, the pixel section 1a as an imaging region and a peripheral circuit section 130 including, for example, a row scanner 131, a horizontal selector 133, a column scanner 134, and a system controller 132 in a peripheral region of the pixel section 1a.

The pixel section 1a has a plurality of unit pixels P (each corresponding to an imaging element 10) two-dimensionally arranged in a matrix, for example. The unit pixels P are wired with pixel drive lines Lread (specifically, row selection lines and reset control lines) for respective pixel rows, and vertical signal lines Lsig for respective pixel columns, for example. The pixel drive lines Lread transmit drive signals for signal reading from the pixels. The pixel drive lines Lread each have one end coupled to a corresponding one of output terminals, corresponding to the respective rows, of the row scanner 131.

The row scanner 131 includes a shift register, an address decoder, and the like, and is a pixel driver, for example, that drives the respective unit pixels P in the pixel section 1a on a row-by-row basis. A signal outputted from each of the unit pixels P of a pixel row selectively scanned by the row scanner 131 is supplied to the horizontal selector 133 through each of the vertical signal lines Lsig. The horizontal selector 133 includes an amplifier, a horizontal selection switch, and the like provided for each of the vertical signal lines Lsig.

The column scanner 134 includes a shift register, an address decoder, and the like, and drives respective horizontal selection switches of the horizontal selector 133 in sequence while scanning the horizontal selection switches. Such selective scanning by the column scanner 134 causes the signals of the respective pixels transmitted through the respective vertical signal lines Lsig to be outputted in sequence to a horizontal signal line 135 and thereafter transmitted to outside of the semiconductor substrate 30 through the horizontal signal line 135.

Circuit components including the row scanner 131, the horizontal selector 133, the column scanner 134, and the horizontal signal line 135 may be formed directly on the semiconductor substrate 30 or disposed in an external control IC. Alternatively, these circuit components may be formed in any other substrate coupled by a cable, or the like.

The system controller 132 receives a clock given from the outside of the semiconductor substrate 30, or data or the like on instructions of operation modes, and also outputs data such as internal information of the imaging device 1. The system controller 132 further has a timing generator that generates various timing signals, and performs drive control of the peripheral circuits such as the row scanner 131, the horizontal selector 133, and the column scanner 134, on the basis of the various timing signals generated by the timing generator.

Application Example 2

The imaging device 1 described above is applicable to, for example, various kinds of electronic apparatuses having imaging functions. Examples of the electronic apparatuses include camera systems such as digital still cameras and video cameras and mobile phones having the imaging functions. FIG. 16 illustrates, for purpose of an example, a schematic configuration of an electronic apparatus 2 (a camera). The electronic apparatus 2 is a video camera that enables shooting of a still image or a moving image, for example, and includes the imaging device 1, an optical system (optical lens) 310, a shutter device 311, a driver 313 that drives the imaging device 1 and the shutter device 311, and a signal processor 312.

The optical system 310 guides image light (incident light) from a subject to the pixel section 1a of the imaging device 1. The optical system 310 may include a plurality of optical lenses. The shutter device 311 controls a period in which the imaging device 1 is irradiated with the light and a period in which the light is blocked. The driver 313 controls a transfer operation of the imaging device 1 and a shutter operation of the shutter device 311. The signal processor 312 performs various kinds of signal processing on signals outputted from the imaging device 1. An image signal Dout having been subjected to the signal processing is stored in a storage medium such as a memory or outputted to a monitor, or the like.

Application Example 3

Further, the imaging device 1 described above is applicable to the following electronic apparatuses (a capsule type endoscope 10100 and a mobile body such as a vehicle).

6. PRACTICAL APPLICATION EXAMPLE (Practical Application Example to In-Vivo Information Acquisition System)

Further, the technology (present technology) according to the present disclosure is applicable to various products. For example, the technology according to the present disclosure may be applied to an endoscopic surgery system.

FIG. 17 is a block diagram depicting an example of a schematic configuration of an in-vivo information acquisition system of a patient using a capsule type endoscope, to which the technology according to an embodiment of the present disclosure (present technology) can be applied.

The in-vivo information acquisition system 10001 includes a capsule type endoscope 10100 and an external controlling apparatus 10200.

The capsule type endoscope 10100 is swallowed by a patient at the time of inspection. The capsule type endoscope 10100 has an image pickup function and a wireless communication function and successively picks up an image of the inside of an organ such as the stomach or an intestine (hereinafter referred to as in-vivo image) at predetermined intervals while it moves inside of the organ by peristaltic motion for a period of time until it is naturally discharged from the patient. Then, the capsule type endoscope 10100 successively transmits information of the in-vivo image to the external controlling apparatus 10200 outside the body by wireless transmission.

The external controlling apparatus 10200 integrally controls operation of the in-vivo information acquisition system 10001. Further, the external controlling apparatus 10200 receives information of an in-vivo image transmitted thereto from the capsule type endoscope 10100 and generates image data for displaying the in-vivo image on a display apparatus (not depicted) on the basis of the received information of the in-vivo image.

In the in-vivo information acquisition system 10001, an in-vivo image imaged a state of the inside of the body of a patient can be acquired at any time in this manner for a period of time until the capsule type endoscope 10100 is discharged after it is swallowed.

A configuration and functions of the capsule type endoscope 10100 and the external controlling apparatus 10200 are described in more detail below.

The capsule type endoscope 10100 includes a housing 10101 of the capsule type, in which a light source unit 10111, an image pickup unit 10112, an image processing unit 10113, a wireless communication unit 10114, a power feeding unit 10115, a power supply unit 10116 and a control unit 10117 are accommodated.

The light source unit 10111 includes a light source such as, for example, a light emitting diode (LED) and irradiates light on an image pickup field-of-view of the image pickup unit 10112.

The image pickup unit 10112 includes an image pickup element and an optical system including a plurality of lenses provided at a preceding stage to the image pickup element. Reflected light (hereinafter referred to as observation light) of light irradiated on a body tissue which is an observation target is condensed by the optical system and introduced into the image pickup element. In the image pickup unit 10112, the incident observation light is photoelectrically converted by the image pickup element, by which an image signal corresponding to the observation light is generated. The image signal generated by the image pickup unit 10112 is provided to the image processing unit 10113.

The image processing unit 10113 includes a processor such as a central processing unit (CPU) or a graphics processing unit (GPU) and performs various signal processes for an image signal generated by the image pickup unit 10112. The image processing unit 10113 provides the image signal for which the signal processes have been performed thereby as RAW data to the wireless communication unit 10114.

The wireless communication unit 10114 performs a predetermined process such as a modulation process for the image signal for which the signal processes have been performed by the image processing unit 10113 and transmits the resulting image signal to the external controlling apparatus 10200 through an antenna 10114A. Further, the wireless communication unit 10114 receives a control signal relating to driving control of the capsule type endoscope 10100 from the external controlling apparatus 10200 through the antenna 10114A. The wireless communication unit 10114 provides the control signal received from the external controlling apparatus 10200 to the control unit 10117.

The power feeding unit 10115 includes an antenna coil for power reception, a power regeneration circuit for regenerating electric power from current generated in the antenna coil, a voltage booster circuit and so forth. The power feeding unit 10115 generates electric power using the principle of non-contact charging.

The power supply unit 10116 includes a secondary battery and stores electric power generated by the power feeding unit 10115. In FIG. 17, in order to avoid complicated illustration, an arrow mark indicative of a supply destination of electric power from the power supply unit 10116 and so forth are omitted. However, electric power stored in the power supply unit 10116 is supplied to and can be used to drive the light source unit 10111, the image pickup unit 10112, the image processing unit 10113, the wireless communication unit 10114 and the control unit 10117.

The control unit 10117 includes a processor such as a CPU and suitably controls driving of the light source unit 10111, the image pickup unit 10112, the image processing unit 10113, the wireless communication unit 10114 and the power feeding unit 10115 in accordance with a control signal transmitted thereto from the external controlling apparatus 10200.

The external controlling apparatus 10200 includes a processor such as a CPU or a GPU, a microcomputer, a control board or the like in which a processor and a storage element such as a memory are mixedly incorporated. The external controlling apparatus 10200 transmits a control signal to the control unit 10117 of the capsule type endoscope 10100 through an antenna 10200A to control operation of the capsule type endoscope 10100. In the capsule type endoscope 10100, an irradiation condition of light upon an observation target of the light source unit 10111 can be changed, for example, in accordance with a control signal from the external controlling apparatus 10200. Further, an image pickup condition (for example, a frame rate, an exposure value or the like of the image pickup unit 10112) can be changed in accordance with a control signal from the external controlling apparatus 10200. Further, the substance of processing by the image processing unit 10113 or a condition for transmitting an image signal from the wireless communication unit 10114 (for example, a transmission interval, a transmission image number or the like) may be changed in accordance with a control signal from the external controlling apparatus 10200.

Further, the external controlling apparatus 10200 performs various image processes for an image signal transmitted thereto from the capsule type endoscope 10100 to generate image data for displaying a picked up in-vivo image on the display apparatus. As the image processes, various signal processes can be performed such as, for example, a development process (demosaic process), an image quality improving process (bandwidth enhancement process, a super-resolution process, a noise reduction (NR) process and/or image stabilization process) and/or an enlargement process (electronic zooming process). The external controlling apparatus 10200 controls driving of the display apparatus to cause the display apparatus to display a picked up in-vivo image on the basis of generated image data. Alternatively, the external controlling apparatus 10200 may also control a recording apparatus (not depicted) to record generated image data or control a printing apparatus (not depicted) to output generated image data by printing.

One example of the in-vivo information acquisition system to which the technology according to the present disclosure is applicable has been described above. The technology according to the present disclosure is applicable to, for example, the image pickup unit 10112 of the configurations described above. This makes it possible to improve accuracy of an inspection.

(Practical Application Example to Endoscopic Surgery System)

The technology (present technology) according to the present disclosure is applicable to various products. For example, the technology according to the present disclosure may be applied to an endoscopic surgery system.

FIG. 18 is a view depicting an example of a schematic configuration of an endoscopic surgery system to which the technology according to an embodiment of the present disclosure (present technology) can be applied.

In FIG. 18, a state is illustrated in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

FIG. 19 is a block diagram depicting an example of a functional configuration of the camera head 11102 and the CCU 11201 depicted in FIG. 18.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

One example of the endoscopic surgery system to which the technology according to the present disclosure is applicable has been described above. The technology according to the present disclosure is applicable to, for example, the image pickup unit 11402 of the configurations described above. Applying the technology according to the present disclosure to the image pickup unit 11402 makes it possible to improve accuracy of an inspection.

It is to be noted that the endoscopic surgery system has been described here as an example, but the technology according to the present disclosure may be additionally applied to, for example, a microscopic surgery system and the like.

(Practical Application Example to Mobile Body)

The technology according to the present disclosure is applicable to various products. For example, the technology according to the present disclosure may be achieved in the form of an apparatus to be mounted to a mobile body of any kind such as an automobile, an electric vehicle, a hybrid electric vehicle, a motorcycle, a bicycle, a personal mobility, an airplane, a drone, a vessel, a robot, a construction machine, and an agricultural machine (tractor).

FIG. 20 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 20, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 20, an audio speaker 12061, a display section 12062, and an instrument panel 12063 are illustrated as the output device. The display section 12062 may, for example, include at least one of an on-board display and a head-up display.

FIG. 21 is a diagram depicting an example of the installation position of the imaging section 12031.

In FIG. 21, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Incidentally, FIG. 21 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

7. EXAMPLES

Next, examples of the present disclosure are described in detail.

Experimental Example 1

An ITO film having a thickness of 100 nm was formed on a quartz substrate 111 with use of a sputtering apparatus. The ITO film was patterned by photolithography and etching to form an ITO electrode (a lower electrode). Subsequently, the quartz substrate provided with the ITO electrode was cleaned by an UV/ozone treatment, and thereafter, the quartz substrate was moved into a vacuum evaporation apparatus, and an organic material was deposited on the quartz substrate under a reduced pressure of $1 \times 10^{-5}$ Pa or less with use of a resistive heating method while rotating a substrate holder. First, an electron blocking material represented by the following formula (3) was deposited with a thickness of 10 nm at a substrate temperature of 0° to form an electron blocking layer. Next, a benzothienobenzothiophene derivative represented by the following formula (1-1), and $C_{60}$ fullerene (the following formula (2)) were respectively deposited at a substrate temperature of 40° C. at deposition rates of 0.50 Å/sec and 0.25 Å/sec to form a mixture layer having a thickness of 230 nm, thereby forming a photoelectric conversion layer. Subsequently, a hole blocking material represented by the following formula (4) was deposited with a thickness of 10 nm at a substrate temperature of 0° C. to form a hole blocking layer. Finally, the quartz substrate was moved into a sputtering apparatus, and ITO was deposited with a thickness of 50 nm on the hole blocking layer to form an upper electrode. A photoelectric conversion element (an experimental example 1) having a 1 mm×1 mm photoelectric conversion region was fabricated by a fabrication method described above. The fabricated photoelectric conversion element was annealed at 150° C. for 120 minutes in a nitrogen ($N_2$) atmosphere.

[Chem. 3]

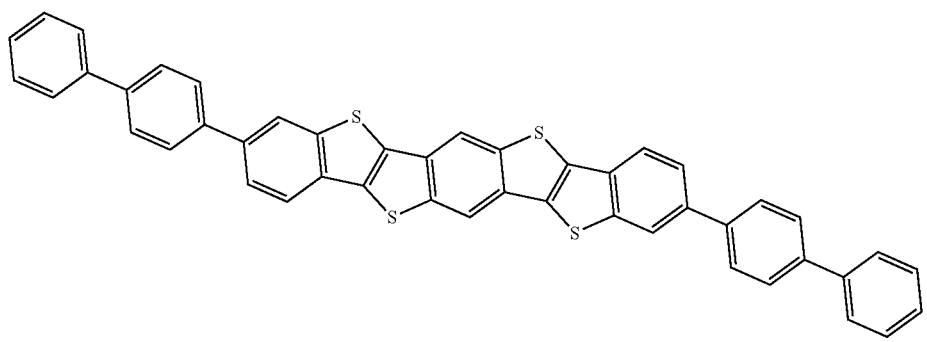

(1-1)

[Chem. 4]

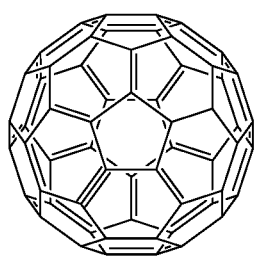

(2)

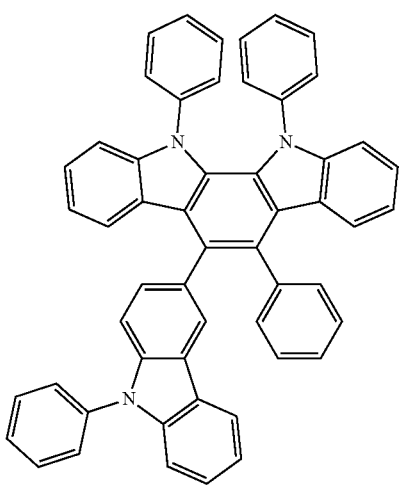

(3)

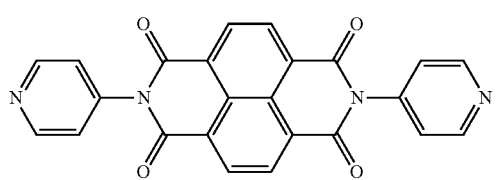

(4)

Experimental Example 2

A photoelectric conversion element (an experimental example 2) was fabricated by a method similar to that in the experimental example 1, except that a benzothienobenzothiophene derivative represented by the following formula (1-2) was used in place of the benzothienobenzothiophene derivative represented by the formula (1-1) used in the experimental example 1.

[Chem. 5]

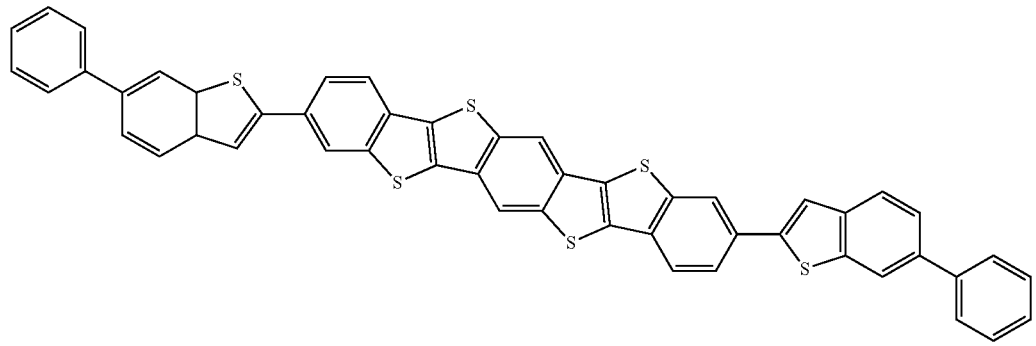

(1-2)

Experimental Example 3

A photoelectric conversion element (an experimental example 3) was fabricated by a method similar to that in the experimental example 1, except that a benzothienobenzothiophene derivative represented by the following formula (1-3) was used in place of the benzothienobenzothiophene derivative represented by the formula (1-1) used in the experimental example 1.

[Chem. 6]

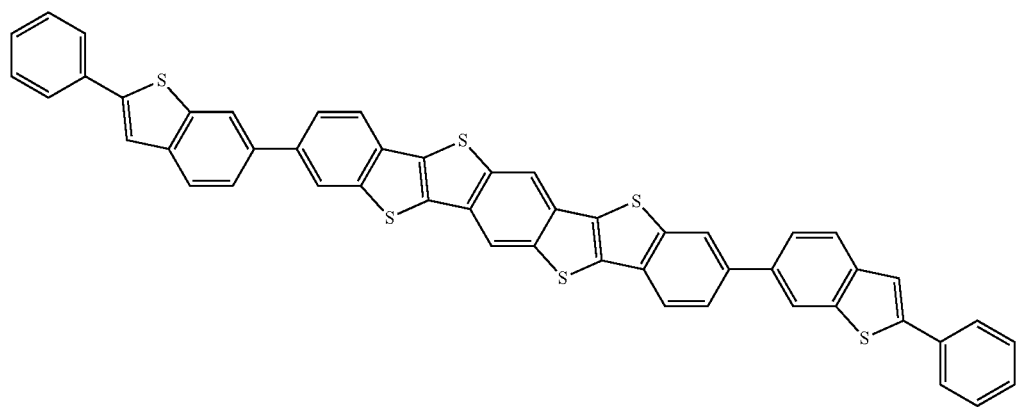

(1-3)

Experimental Example 4

A photoelectric conversion element (an experimental example 4) was fabricated by a method similar to that in the experimental example 1, except that a benzothienobenzothiophene derivative represented by the following formula (1-4) was used in place of the benzothienobenzothiophene derivative represented by the formula (1-1) used in the experimental example 1.

[Chem. 7]

(1-4)

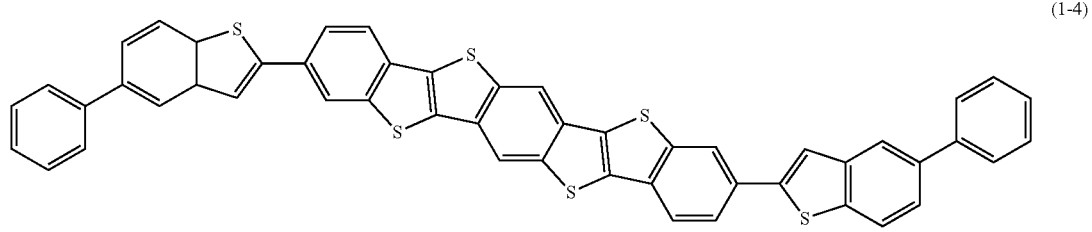

Experimental Example 5

A photoelectric conversion element (an experimental example 5) was fabricated by a method similar to that in the experimental example 1, except that a benzothienobenzothiophene derivative represented by the following formula (1-5) was used in place of the benzothienobenzothiophene derivative represented by the formula (1-1) used in the experimental example 1.

[Chem. 8]

(1-5)

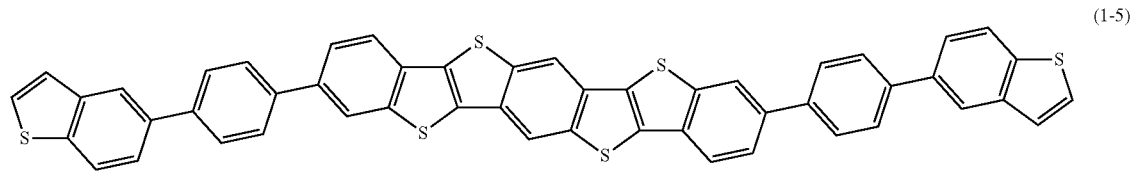

Experimental Example 6

A photoelectric conversion element (an experimental example 6) was fabricated by a method similar to that in the experimental example 1, except that a benzothienobenzothiophene derivative represented by the following formula (1-6) was used in place of the benzothienobenzothiophene derivative represented by the formula (1-1) used in the experimental example 1.

[Chem. 9]

(1-6)

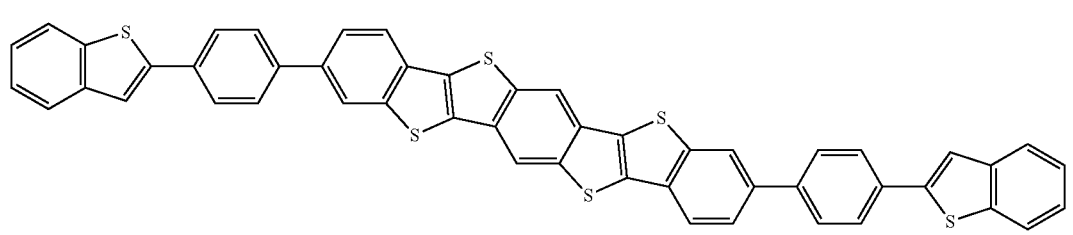

Experimental Example 7

A photoelectric conversion element (an experimental example 7) was fabricated by a method similar to that in the experimental example 1, except that a benzothienobenzothiophene derivative represented by the following formula (1-7) was used in place of the benzothienobenzothiophene derivative represented by the formula (1-1) used in the experimental example 1.

[Chem. 10]

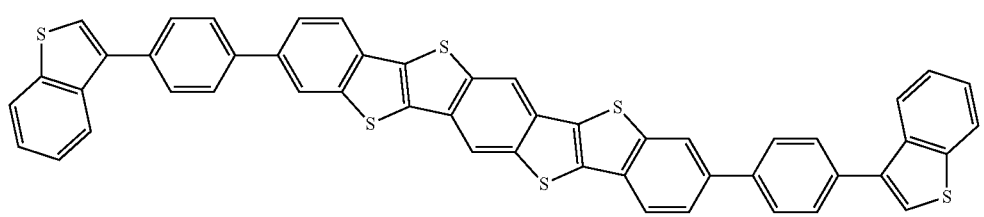

(1-7)

Experimental Example 8

A photoelectric conversion element (an experimental example 8) was fabricated by a method similar to that in the experimental example 1, except that a benzothienobenzothiophene derivative represented by the following formula (1-8) was used in place of the benzothienobenzothiophene derivative represented by the formula (1-1) used in the experimental example 1.

[Chem. 11]

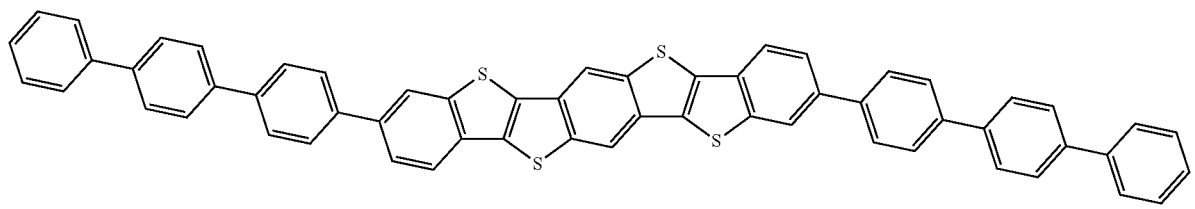

(1-8)

Experimental Example 9

A photoelectric conversion element (an experimental example 9) was fabricated by a method similar to that in the experimental example 1, except that a benzothienobenzothiophene derivative represented by the following formula (1-9) was used in place of the benzothienobenzothiophene derivative represented by the formula (1-1) used in the experimental example 1.

[Chem. 12]

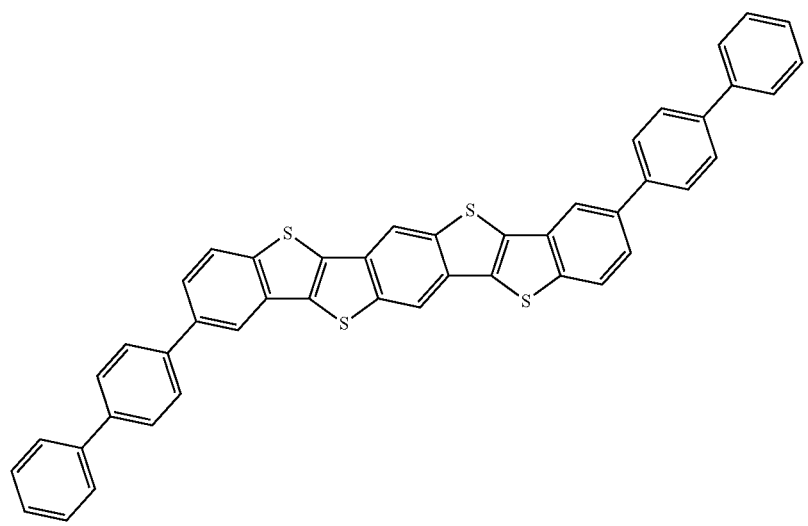

(1-9)

Experimental Example 10

A photoelectric conversion element (an experimental example 10) was fabricated by a method similar to that in the experimental example 1, except that a benzothienobenzothiophene derivative represented by the following formula (1-10) was used in place of the benzothienobenzothiophene derivative represented by the formula (1-1) used in the experimental example 1.

[Chem. 13]

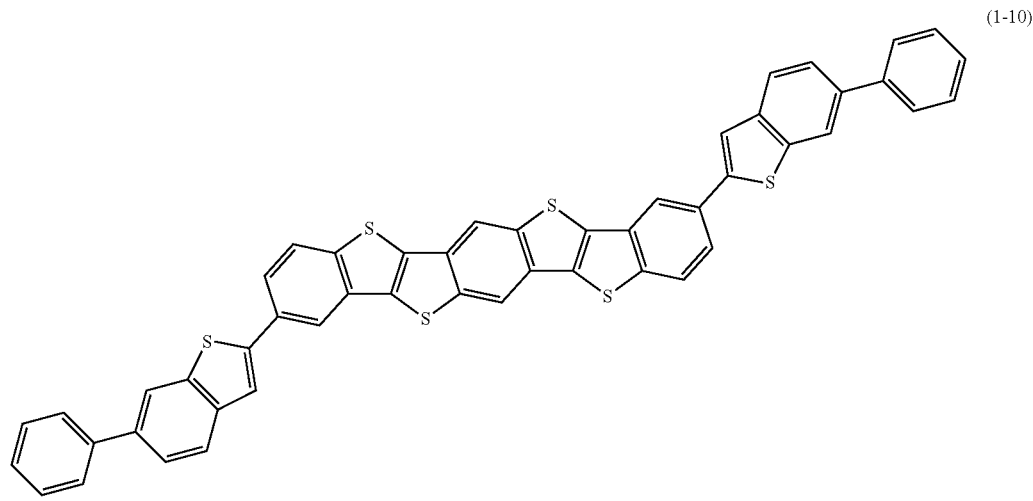

(1-10)

Experimental Example 11

A photoelectric conversion element (an experimental example 11) was fabricated by a method similar to that in the experimental example 1, except that a photoelectric conversion layer was formed by using two kinds of benzothienobenzothiophene derivatives represented by the formula (1-1) and the formula (1-7) and $C_{60}$ fullerene (the formula (2) described above).

Experimental Example 12

A photoelectric conversion element (an experimental example 12) was fabricated by a method similar to that in the experimental example 2, except that a photoelectric conversion layer was formed by using two kinds of benzothienobenzothiophene derivatives represented by the formula (1-2) and the formula (1-7) and $C_{60}$ fullerene (the formula (2) described above).

Experimental Example 13

A photoelectric conversion element (an experimental example 13) was fabricated by a method similar to that in the experimental example 3, except that a photoelectric conversion layer was formed by using two kinds of benzothienobenzothiophene derivatives represented by the formula (1-3) and the formula (1-7) and $C_{60}$ fullerene (the formula (2) described above).

Experimental Example 14

A photoelectric conversion element (an experimental example 14) was fabricated by a method similar to that in the experimental example 4, except that a photoelectric conversion layer was formed by using two kinds of benzothienobenzothiophene derivatives represented by the formula (1-4) and the formula (1-7) and $C_{60}$ fullerene (the formula (2) described above).

Experimental Example 15

A photoelectric conversion element (an experimental example 15) was fabricated by a method similar to that in the experimental example 5, except that a photoelectric conversion layer was formed by using two kinds of benzothienobenzothiophene derivatives represented by the formula (1-5) and the formula (1-7) and $C_{60}$ fullerene (the formula (2) described above).

Experimental Example 16

A photoelectric conversion element (an experimental example 16) was fabricated by a method similar to that in the experimental example 6, except that a photoelectric conversion layer was formed by using two kinds of benzothienobenzothiophene derivatives represented by the formula (1-6) and the formula (1-7) and $C_{60}$ fullerene (the formula (2) described above).

Experimental Example 17

A photoelectric conversion element (an experimental example 17) was fabricated by a method similar to that in the experimental example 8, except that a photoelectric conversion layer was formed by using two kinds of benzothienobenzothiophene derivatives represented by the formula (1-8) and the formula (1-7) and $C_{60}$ fullerene (the formula (2) described above).

Experimental Example 18

A photoelectric conversion element (an experimental example 18) was fabricated by a method similar to that in the experimental example 9, except that a photoelectric conversion layer was formed by using two kinds of benzothienobenzothiophene derivatives represented by the formula (1-9) and the formula (1-7) and $C_{60}$ fullerene (the formula (2) described above).

Experimental Example 19

A photoelectric conversion element (an experimental example 19) was fabricated by a method similar to that in the experimental example 10, except that a photoelectric conversion layer was formed by using two kinds of benzothienobenzothiophene derivatives represented by the formula (1-10) and the formula (1-7) and $C_{60}$ fullerene (the formula (2) described above).

Experimental Example 20

A photoelectric conversion element (an experimental example 20) was fabricated by a method similar to that in the experimental example 1, except that a photoelectric conversion layer was formed by using DNTT represented by the following formula (5) and $C_{60}$ fullerene (the formula (2) described above).

[Chem. 14]

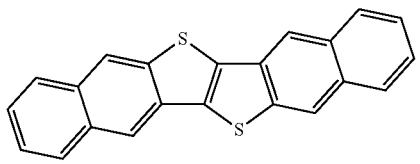

(5)

Experimental Example 21

A photoelectric conversion element (an experimental example 20) was fabricated by a method similar to that in the experimental example 1, except that a photoelectric conversion layer was formed by using DPh-BTBT represented by the following formula (6) and $C_{60}$ fullerene (the formula (2) described above).

[Chem. 15]

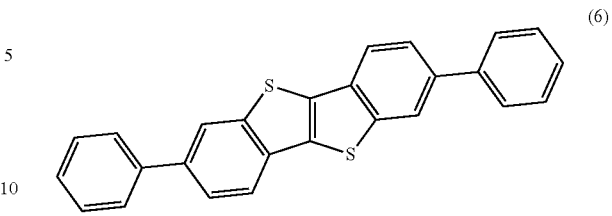

(6)

Evaluation of external quantum efficiency (EQE) and response time of each of the photoelectric conversion elements fabricated in the experimental examples 1 to 21 was performed by the following method. Table 1 is a summary of results of the evaluation with the benzothienobenzothiophene derivatives used in the respective experimental examples.

A wavelength of light to be applied from a blue LED light source to each of the photoelectric conversion elements via a band-pass filter was set to 450 nm and a light amount was set to 1.62 μW/cm², and a bias voltage to be applied between electrodes of each of the photoelectric conversion elements was controlled with use of a semiconductor parameter analyzer to sweep a voltage to be applied to a lower electrode with respect to an upper electrode, thereby obtaining a current-voltage curve. A light current value and a dark current value in a short circuit state were measured to calculate EQE. Further, in a state in which a bias voltage to be applied between electrodes of each of the photoelectric conversion elements was controlled and a voltage of −2.6V was applied to the lower electrode with respect to the upper electrode, the photoelectric conversion elements were irradiated with a rectangular optical pulse having a wavelength of 450 nm and a light amount of 1.62 μW/cm², and an attenuation waveform of a current was observed with use of an oscilloscope. A period of time until a current attenuated to 3% from a current at the time of optical pulse irradiation immediately after optical pulse irradiation was used as an index of response speed.

TABLE 1

| | Configuration of Photoelectric Conversion Layer | EQE (Normalization) | Response Time (Normalization) |
|---|---|---|---|
| Experimental Example 1 | Formula (1-1), Formula (2) | 1.00 | 1.00 |
| Experimental Example 2 | Formula (1-2), Formula (2) | 1.05 | 0.85 |
| Experimental Example 3 | Formula (1-3), Formula (2) | 0.65 | 2.50 |
| Experimental Example 4 | Formula (1-4), Formula (2) | 0.80 | 1.15 |
| Experimental Example 5 | Formula (1-5), Formula (2) | 0.90 | 0.50 |
| Experimental Example 6 | Formula (1-6), Formula (2) | 1.10 | 0.60 |
| Experimental Example 7 | Formula (1-7), Formula (2) | 0.60 | 0.90 |
| Experimental Example 8 | Formula (1-8), Formula (2) | 1.00 | 0.70 |
| Experimental Example 9 | Formula (1-9), Formula (2) | 0.50 | 5.00 |
| Experimental Example 10 | Formula (1-10), Formula (2) | 0.90 | 1.00 |
| Experimental Example 11 | Formula (1-1), Formula (1-7), Formula (2) | 0.95 | 0.95 |
| Experimental Example 12 | Formula (1-2), Formula (1-7), Formula (2) | 1.00 | 0.80 |
| Experimental Example 13 | Formula (1-3), Formula (1-7), Formula (2) | 0.60 | 2.50 |
| Experimental Example 14 | Formula (1-4), Formula (1-7), Formula (2) | 0.70 | 1.10 |
| Experimental Example 15 | Formula (1-5), Formula (1-7), Formula (2) | 0.80 | 0.40 |
| Experimental Example 16 | Formula (1-6), Formula (1-7), Formula (2) | 1.00 | 0.50 |
| Experimental Example 17 | Formula (1-8), Formula (1-7), Formula (2) | 0.95 | 0.60 |
| Experimental Example 18 | Formula (1-9), Formula (1-7), Formula (2) | 0.10 | >10 |
| Experimental Example 19 | Formula (1-10), Formula (1-7), Formula (2) | 0.80 | 1.00 |
| Experimental Example 20 | Formula (5), Formula (2) | 1.00 | >1000 |
| Experimental Example 21 | Formula (6), Formula (2) | 0.60 | >1000 |

As can be seen from Table 1, in the experimental examples 1 to 19 in which the photoelectric conversion layer was formed by using the benzothienobenzothiophene-based compound represented by the general formula (1) described above, obtained EQE was substantially equal to EQE in the experimental examples 20 and 21 in which the photoelectric conversion layer was formed by using typical materials. In addition, it was found out that in the experimental examples 1 to 19 in which the photoelectric conversion layer was formed by using the benzothienobenzothiophene-based compound represented by the general formula (1) described above, the response time was remarkably improved, as compared with the experimental examples 20 and 21 in which the photoelectric conversion layer was formed by using the typical materials. Accordingly, it was found out that forming the photoelectric conversion layer by using the benzothienobenzothiophene-based compound represented by the general formula (1) makes it possible to improve optical responsivity while maintaining high EQE.

Although the description has been given by referring to the first to fourth embodiments, the examples, and the application examples, the contents of the present disclosure are not limited to the embodiments and the like described above, and may be modified in a variety of ways. In addition, the number of organic photoelectric converters, the number of inorganic photoelectric converters, a ratio between the organic photoelectric converters and the inorganic photoelectric converters are not limited, and color signals of a plurality of colors may be acquired only by the organic photoelectric converter.

Further, in the embodiments and the like described above, an example in which two electrodes, that is, the readout electrode 21A and the accumulation electrode 21B are provided as a plurality of electrodes included in the lower electrode 21 has been described; however, three, or four or more electrodes such as a transfer electrode or an discharge electrode may be provided.

It is to be noted that the effects described herein are merely illustrative and non-limiting, and other effects may be included.

It is to be noted that the present disclosure may have the following configurations. According to the present technology having the following configuration, the organic photoelectric conversion layer is formed by using the benzothienobenzothiophene-based compound represented by the general formula (1) described above, thereby improving carrier mobility to the first electrode and the second electrode that are opposed to each other with the organic photoelectric conversion layer interposed therebetween. This makes it possible to improve external quantum efficiency and optical responsivity.

[1]
A photoelectric conversion element including:
a first electrode;
a second electrode that is opposed to the first electrode; and
an organic photoelectric conversion layer that is provided between the first electrode and the second electrode, and includes, as a first organic semiconductor material, a benzothienobenzothiophene-based compound represented by the following general formula (1).

[Chem. 1]

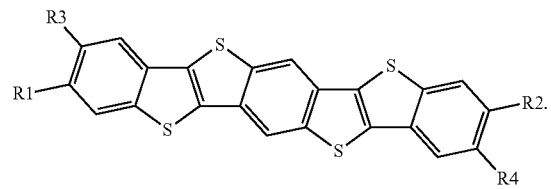

(1)

(R1 to R4 are each independently a phenyl group, a biphenyl group, a terphenyl group, a naphthalene group, a phenylnaphthalene group, a biphenylnaphthalene group, a binaphthalene group, a thiophene group, a bithiophene group, a terthiophene group, a benzothiophene group, a phenyl benzothiophene group, a biphenyl benzothiophene benzofuran group, a phenyl benzofuran group, a biphenyl benzothiophene group, an alkane group, a cycloalkane group, a fluorene group, a phenylfluorene group, or any of derivatives thereof.)

[2]
The photoelectric conversion element according to [1], in which the organic photoelectric conversion layer further includes fullerene or a fullerene derivative as a second organic semiconductor material.

[3]
The photoelectric conversion element according to [1] or [2], in which the organic photoelectric conversion layer further includes a third organic semiconductor material.

[4]
The photoelectric conversion element according to [3], in which the third organic semiconductor material absorbs light of any of wavelengths from 400 nm to 700 nm both inclusive.

[5]
The photoelectric conversion element according to any one of [1] to [4], in which the organic photoelectric conversion layer absorbs light of all wavelengths within a range from 400 nm to 700 nm both inclusive.

[6]
The photoelectric conversion element according to any one of [1] to [5], in which the first electrode includes a plurality of electrodes.

[7]
The photoelectric conversion element according to any one of [1] to [6], in which a first electric charge blocking layer is further provided between the first electrode and the organic photoelectric conversion layer.

[8]
The photoelectric conversion element according to any one of [1] to [7], in which a second electric charge blocking layer is further provided between the organic photoelectric conversion layer and the second electrode.

[9]
An imaging device provided with a plurality of pixels each including one or a plurality of organic photoelectric converters, the organic photoelectric converters each including:
a first electrode;
a second electrode that is opposed to the first electrode; and
an organic photoelectric conversion layer that is provided between the first electrode and the second electrode, and includes, as a first organic semiconductor material, a benzothienobenzothiophene-based compound represented by the following general formula (1).

[Chem. 2]

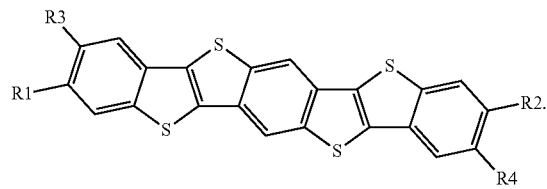

(1)

(R1 to R4 are each independently a phenyl group, a biphenyl group, a terphenyl group, a naphthalene group, a phenylnaphthalene group, a biphenylnaphthalene group, a binaphthalene group, a thiophene group, a bithiophene group, a terthiophene group, a benzothiophene group, a phenyl benzothiophene group, a biphenyl benzothiophene benzofuran group, a phenyl benzofuran group, a biphenyl benzothiophene group, an alkane group, a cycloalkane group, a fluorene group, a phenylfluorene group, or any of derivatives thereof.)

[10]

The imaging device according to [9], in which one or a plurality of the organic photoelectric converters and one or a plurality of inorganic photoelectric converters that performs photoelectric conversion in a wavelength band different from the organic photoelectric converters are stacked in each of the pixels.

[11]

The imaging device according to [10], in which the inorganic photoelectric converter is formed to be embedded in a semiconductor substrate, and the organic photoelectric converter is formed on a first surface side of the semiconductor substrate.

[12]

The imaging device according to [11], in which the semiconductor substrate has a second surface that is opposed to the first surface, and a multilayer wiring layer is formed on the second surface side.

[13]

The imaging device according to [11] or [12], in which the organic photoelectric converter performs photoelectric conversion of blue light, and an inorganic photoelectric converter that performs photoelectric conversion of green light and an inorganic photoelectric converter that performs photoelectric conversion of red light are stacked in the semiconductor substrate.

[14]

The imaging device according to any one of [9] to [13], in which a plurality of the organic photoelectric converters that performs photoelectric conversion in wavelength bands different from each other is stacked in each of the pixels.

This application claims the benefit of Japanese Priority Patent Application JP2019-062367 filed with the Japan Patent Office on Mar. 28, 2019, the entire contents of which are incorporated herein by reference.

It should be understood by those skilled in the art that various modifications, combinations, sub-combinations, and alterations may occur depending on design requirements and other factors insofar as they are within the scope of the appended claims or the equivalents thereof.

The invention claimed is:

1. A photoelectric conversion element comprising:
a first electrode;
a second electrode that is opposed to the first electrode; and
an organic photoelectric conversion layer that is provided between the first electrode and the second electrode, and includes, as a first organic semiconductor material, a benzothienobenzothiophene-based compound represented by the following general formula (1):

[Chem. 1]

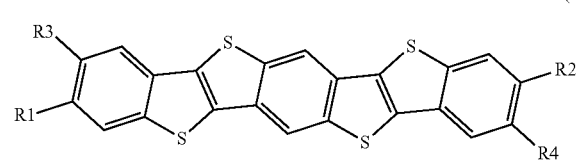

(1)

(R1 to R4 are each independently a phenyl group, a biphenyl group, a terphenyl group, a naphthalene group, a phenylnaphthalene group, a biphenylnaphthalene group, a binaphthalene group, a thiophene group, a bithiophene group, a terthiophene group, a benzothiophene group, a phenyl benzothiophene group, a biphenyl benzothiophene benzofuran group, a phenyl benzofuran group, a biphenyl benzothiophene group, an alkane group, a cycloalkane group, a fluorene group, a phenylfluorene group, or any of derivatives thereof).

2. The photoelectric conversion element according to claim 1, wherein the organic photoelectric conversion layer further includes fullerene or a fullerene derivative as a second organic semiconductor material.

3. The photoelectric conversion element according to claim 1, wherein the organic photoelectric conversion layer further includes a third organic semiconductor material.

4. The photoelectric conversion element according to claim 3, wherein the third organic semiconductor material absorbs light of any of wavelengths from 400 nm to 700 nm both inclusive.

5. The photoelectric conversion element according to claim 1, wherein the organic photoelectric conversion layer absorbs light of all wavelengths within a range from 400 nm to 700 nm both inclusive.

6. The photoelectric conversion element according to claim 1, wherein the first electrode includes a plurality of electrodes.

7. The photoelectric conversion element according to claim 1, wherein a first electric charge blocking layer is further provided between the first electrode and the organic photoelectric conversion layer.

8. The photoelectric conversion element according to claim 1, wherein a second electric charge blocking layer is further provided between the organic photoelectric conversion layer and the second electrode.

9. An imaging device provided with a plurality of pixels each including one or a plurality of organic photoelectric converters, the organic photoelectric converters each comprising:
a first electrode;
a second electrode that is opposed to the first electrode; and
an organic photoelectric conversion layer that is provided between the first electrode and the second electrode, and includes, as a first organic semiconductor material, a benzothienobenzothiophene-based compound represented by the following general formula (1);

[Chem. 2]

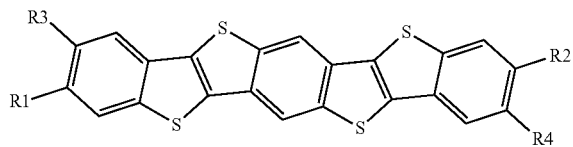

(1)

(R1 to R4 are each independently a phenyl group, a biphenyl group, a terphenyl group, a naphthalene group, a phenylnaphthalene group, a biphenylnaphthalene group, a binaphthalene group, a thiophene group, a bithiophene group, a terthiophene group, a benzothiophene group, a phenyl benzothiophene group, a biphenyl benzothiophene benzofuran group, a phenyl benzofuran group, a biphenyl benzothiophene group, an alkane group, a cycloalkane group, a fluorene group, a phenylfluorene group, or any of derivatives thereof).

10. The imaging device according to claim 9, wherein one or a plurality of the organic photoelectric converters and one or a plurality of inorganic photoelectric converters that performs photoelectric conversion in a wavelength band different from the organic photoelectric converters are stacked in each of the pixels.

11. The imaging device according to claim 10, wherein the inorganic photoelectric converter is formed to be embedded in a semiconductor substrate, and the organic photoelectric converter is formed on a first surface side of the semiconductor substrate.

12. The imaging device according to claim 11, wherein the semiconductor substrate has a second surface that is opposed to the first surface, and a multilayer wiring layer is formed on the second surface side.

13. The imaging device according to claim 11, wherein the organic photoelectric converter performs photoelectric conversion of blue light, and an inorganic photoelectric converter that performs photoelectric conversion of green light and an inorganic photoelectric converter that performs photoelectric conversion of red light are stacked in the semiconductor substrate.

14. The imaging device according to claim 9, wherein a plurality of the organic photoelectric converters that performs photoelectric conversion in wavelength bands different from each other is stacked in each of the pixels.

* * * * *